(12) United States Patent
Moriceau et al.

(10) Patent No.: US 8,193,069 B2
(45) Date of Patent: Jun. 5, 2012

(54) STACKED STRUCTURE AND PRODUCTION METHOD THEREOF

(75) Inventors: Hubert Moriceau, Saint-Egreve (FR); Bernard Aspar, Rives (FR); Jacques Margail, La Tronche (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/565,621

(22) PCT Filed: Jul. 15, 2004

(86) PCT No.: PCT/FR2004/001858
§ 371 (c)(1),
(2), (4) Date: Jul. 25, 2006

(87) PCT Pub. No.: WO2005/019094
PCT Pub. Date: Mar. 3, 2005

(65) Prior Publication Data
US 2006/0281212 A1    Dec. 14, 2006

(30) Foreign Application Priority Data

Jul. 21, 2003  (FR) .................................. 03 08865

(51) Int. Cl.
*H01L 21/76* (2006.01)
(52) U.S. Cl. .. 438/455; 438/406; 438/756; 257/E21.561
(58) Field of Classification Search .................. 438/406, 438/455, 459, 311, 756
See application file for complete search history.

(56) References Cited

U.S. PATENT DOCUMENTS

| 3,901,423 A | 8/1975 | Hillberry et al. |
| 3,915,757 A | 10/1975 | Engel |
| 3,957,107 A | 5/1976 | Altoz et al. |
| 3,993,909 A | 11/1976 | Drews et al. |
| 4,006,340 A | 2/1977 | Gorinas |

(Continued)

FOREIGN PATENT DOCUMENTS

EP    0 355 913    2/1990

(Continued)

OTHER PUBLICATIONS

Alley et al., "Surface Roughness Modification of Interfacial Contacts in Polysilicon Microstructures", Proceedings of the 7th International Conference on Solid-State Sensors and Actuators, "Transducers '93," pp. 288-291, Jun. 7-10, 1993, PACIFICO, Yokohama, Japan.

(Continued)

*Primary Examiner* — Charles Garber
*Assistant Examiner* — Reema Patel
(74) *Attorney, Agent, or Firm* — Brinks Hofer Gilson & Lione

(57) ABSTRACT

The invention relates to a method of producing a stacked structure. The inventive method comprises the following steps consisting in: a) using a first plate (1) which is, for example, made from silicon, and a second plate (5) which is also, for example, made from silicon, such that at least one of said first (1) and second (5) plates has, at least in part, a surface (2; 7) that cannot bond to the other plate; b) providing a surface layer (3; 8), which is, for example, made from silicon oxide, on at least one part of the surface (2) of the first plate and/or the surface (7) of the second plate (5); and c) bonding the two plates (1; 5) to one another. The aforementioned bonding incompatibility can, for example, result from the physicochemical nature of the surface or of a coating applied thereto, or from a roughness value ($r'_2$, $r'_7$) which is greater than a predetermined threshold. The invention also relates to a stacked structure produced using the inventive method.

20 Claims, 3 Drawing Sheets

U.S. PATENT DOCUMENTS

| | | | |
|---|---|---|---|
| 4,028,149 A | 6/1977 | Deines et al. | |
| 4,039,416 A | 8/1977 | White | |
| 4,074,139 A | 2/1978 | Pankove | |
| 4,107,350 A | 8/1978 | Berg et al. | |
| 4,108,751 A | 8/1978 | King | |
| 4,121,334 A | 10/1978 | Wallis | |
| 4,170,662 A | 10/1979 | Weiss et al. | |
| 4,179,324 A | 12/1979 | Kirkpatrick | |
| 4,244,348 A | 1/1981 | Wilkes | |
| 4,252,837 A | 2/1981 | Auton | |
| 4,254,590 A | 3/1981 | Eisele et al. | |
| 4,274,004 A | 6/1981 | Kanai | |
| 4,342,631 A | 8/1982 | White et al. | |
| 4,346,123 A | 8/1982 | Kaufmann | |
| 4,361,600 A | 11/1982 | Brown | |
| 4,368,083 A | 1/1983 | Bruel et al. | |
| 4,412,868 A | 11/1983 | Brown et al. | |
| 4,452,644 A | 6/1984 | Bruel et al. | |
| 4,468,309 A | 8/1984 | White | |
| 4,471,003 A | 9/1984 | Cann | |
| 4,486,247 A | 12/1984 | Ecer et al. | |
| 4,490,190 A | 12/1984 | Speri | |
| 4,500,563 A | 2/1985 | Ellenberger et al. | |
| 4,508,056 A | 4/1985 | Bruel et al. | |
| 4,536,657 A | 8/1985 | Bruel | |
| 4,539,050 A | 9/1985 | Kramler et al. | |
| 4,542,863 A | 9/1985 | Larson | |
| 4,566,403 A | 1/1986 | Fournier | |
| 4,567,505 A | 1/1986 | Pease | |
| 4,568,563 A | 2/1986 | Jackson et al. | |
| 4,585,945 A | 4/1986 | Bruel et al. | |
| 4,630,093 A | 12/1986 | Yamaguchi et al. | |
| 4,684,535 A | 8/1987 | Heinecke et al. | |
| 4,704,302 A | 11/1987 | Bruel et al. | |
| 4,717,683 A | 1/1988 | Parrillo et al. | |
| 4,764,394 A | 8/1988 | Conrad | |
| 4,837,172 A | 6/1989 | Mizuno et al. | |
| 4,846,928 A | 7/1989 | Dolins et al. | |
| 4,847,792 A | 7/1989 | Barna et al. | |
| 4,853,250 A | 8/1989 | Boulos et al. | |
| 4,887,005 A | 12/1989 | Rough et al. | |
| 4,894,709 A | 1/1990 | Phillips et al. | |
| 4,904,610 A | 2/1990 | Shyr | |
| 4,920,396 A | 4/1990 | Shinohara et al. | |
| 4,929,566 A | 5/1990 | Beitman | |
| 4,931,405 A | 6/1990 | Kamijo et al. | |
| 4,948,458 A | 8/1990 | Ogle | |
| 4,952,273 A | 8/1990 | Popov | |
| 4,956,698 A | 9/1990 | Wang | |
| 4,960,073 A | 10/1990 | Suzuki et al. | |
| 4,975,126 A | 12/1990 | Margail et al. | |
| 4,982,090 A | 1/1991 | Wittmaack | |
| 4,996,077 A | 2/1991 | Moslehi et al. | |
| 5,013,681 A | 5/1991 | Godbey et al. | |
| 5,015,353 A | 5/1991 | Hubler et al. | |
| 5,034,343 A | 7/1991 | Rouse et al. | |
| 5,036,023 A | 7/1991 | Dautremont-Smith et al. | |
| 5,110,748 A | 5/1992 | Sarma | |
| 5,120,666 A | 6/1992 | Gotou | |
| 5,138,422 A | 8/1992 | Fujii et al. | |
| 5,198,371 A | 3/1993 | Li | |
| 5,200,805 A | 4/1993 | Parsons et al. | |
| 5,232,870 A | 8/1993 | Ito et al. | |
| 5,234,535 A | 8/1993 | Beyer et al. | |
| 5,242,863 A | 9/1993 | Xiang-Zheng et al. | |
| 5,250,446 A | 10/1993 | Osawa et al. | |
| 5,256,581 A | 10/1993 | Foerstner et al. | |
| 5,259,247 A | 11/1993 | Bantien | |
| 5,300,788 A | 4/1994 | Fan et al. | |
| 5,310,446 A | 5/1994 | Konishi et al. | |
| 5,400,458 A | 3/1995 | Rambosek | |
| 5,405,802 A | 4/1995 | Yamagata et al. | |
| 5,413,951 A | 5/1995 | Ohori et al. | |
| 5,494,835 A | 2/1996 | Bruel | |
| 5,524,339 A | 6/1996 | Gorowitz et al. | |
| 5,559,043 A | 9/1996 | Bruel | |
| 5,567,654 A | 10/1996 | Beilstein, Jr. et al. | |
| 5,611,316 A | 3/1997 | Oshima et al. | |
| 5,618,739 A | 4/1997 | Takahashi et al. | |
| 5,622,896 A | 4/1997 | Knotter et al. | |
| 5,633,174 A | 5/1997 | Li | |
| 5,661,333 A | 8/1997 | Bruel et al. | |
| 5,714,395 A | 2/1998 | Bruel | |
| 5,804,086 A | 9/1998 | Bruel | |
| 5,811,348 A | 9/1998 | Matushita et al. | |
| 5,817,368 A | 10/1998 | Hashimoto | |
| 5,854,123 A | 12/1998 | Sato et al. | |
| 5,863,830 A | 1/1999 | Bruel et al. | |
| 5,863,832 A | 1/1999 | Doyle et al. | |
| 5,877,070 A | 3/1999 | Goesele et al. | |
| 5,882,987 A | 3/1999 | Srikrishnan | |
| 5,897,331 A | 4/1999 | Sopori | |
| 5,909,627 A | 6/1999 | Egloff | |
| 5,920,764 A | 7/1999 | Hanson et al. | |
| 5,953,622 A | 9/1999 | Lee et al. | |
| 5,966,620 A | 10/1999 | Sakaguchi et al. | |
| 5,981,400 A | 11/1999 | Lo | |
| 5,985,412 A | 11/1999 | Gösele | |
| 5,993,677 A | 11/1999 | Biasse et al. | |
| 5,994,207 A | 11/1999 | Henley et al. | |
| 6,001,666 A * | 12/1999 | Diem et al. | 438/52 |
| 6,010,591 A | 1/2000 | Gösele | |
| 6,013,563 A | 1/2000 | Henley et al. | |
| 6,013,954 A | 1/2000 | Hamajima | |
| 6,020,252 A | 2/2000 | Aspar et al. | |
| 6,033,974 A | 3/2000 | Henley et al. | |
| 6,048,411 A | 4/2000 | Henley et al. | |
| 6,054,363 A | 4/2000 | Sakaguchi et al. | |
| 6,054,370 A | 4/2000 | Doyle | |
| 6,057,212 A | 5/2000 | Chan et al. | |
| 6,071,795 A | 6/2000 | Cheung et al. | |
| 6,096,433 A | 8/2000 | Kikuchi et al. | |
| 6,103,597 A | 8/2000 | Aspar et al. | |
| 6,103,599 A | 8/2000 | Henley et al. | |
| 6,118,181 A | 9/2000 | Merchant et al. | |
| 6,127,199 A | 10/2000 | Inoue | |
| 6,146,979 A * | 11/2000 | Henley et al. | 438/458 |
| 6,150,239 A | 11/2000 | Goesele et al. | |
| 6,156,215 A | 12/2000 | Shimada et al. | |
| 6,159,323 A | 12/2000 | Joly et al. | |
| 6,190,998 B1 | 2/2001 | Bruel et al. | |
| 6,198,159 B1 | 3/2001 | Hosoma et al. | |
| 6,200,878 B1 | 3/2001 | Yamagata et al. | |
| 6,204,079 B1 | 3/2001 | Aspar et al. | |
| 6,225,190 B1 | 5/2001 | Bruel et al. | |
| 6,225,192 B1 | 5/2001 | Aspar et al. | |
| 6,271,101 B1 | 8/2001 | Fukunaga | |
| 6,294,478 B1 | 9/2001 | Shkaguchi et al. | |
| 6,303,468 B1 | 10/2001 | Aspar et al. | |
| 6,316,333 B1 | 11/2001 | Bruel et al. | |
| 6,323,108 B1 | 11/2001 | Kub et al. | |
| 6,323,109 B1 | 11/2001 | Okonogi | |
| 6,346,458 B1 | 2/2002 | Bower | |
| 6,362,077 B1 | 3/2002 | Aspar et al. | |
| 6,362,082 B1 | 3/2002 | Doyle et al. | |
| 6,417,075 B1 * | 7/2002 | Haberger et al. | 438/459 |
| 6,429,094 B1 * | 8/2002 | Maleville et al. | 438/455 |
| 6,429,104 B1 | 8/2002 | Auberton-Herve | |
| 6,513,564 B2 | 2/2003 | Bryan et al. | |
| 6,534,380 B1 | 3/2003 | Yamauchi et al. | |
| 6,593,212 B1 | 7/2003 | Kub et al. | |
| 6,764,936 B2 | 7/2004 | Daneman et al. | |
| 6,902,987 B1 * | 6/2005 | Tong et al. | 438/455 |
| 6,974,759 B2 * | 12/2005 | Moriceau et al. | 438/459 |
| 2001/0007367 A1 | 7/2001 | Ohkubo | |
| 2001/0007789 A1 | 7/2001 | Aspar et al. | |
| 2002/0025604 A1 | 2/2002 | Tiwari | |
| 2002/0083387 A1 | 6/2002 | Miner et al. | |
| 2002/0145489 A1 | 10/2002 | Cornett et al. | |
| 2002/0153563 A1 | 10/2002 | Ogura | |
| 2002/0185684 A1 | 12/2002 | Campbell et al. | |
| 2003/0077885 A1 * | 4/2003 | Aspar et al. | 438/517 |
| 2003/0119279 A1 * | 6/2003 | Enquist | 438/455 |
| 2003/0134489 A1 | 7/2003 | Schwarzenbach et al. | |
| 2004/0222500 A1 | 11/2004 | Aspar et al. | 257/629 |
| 2005/0042842 A1 * | 2/2005 | Lei et al. | 438/459 |
| 2005/0112845 A1 * | 5/2005 | Ghyselen et al. | 438/455 |

FOREIGN PATENT DOCUMENTS

| | | |
|---|---|---|
| EP | 0 410 679 A1 | 1/1991 |
| EP | 0 504 714 | 9/1992 |
| EP | 0 533 551 A1 | 3/1993 |
| EP | 0 293 049 B1 | 9/1993 |
| EP | 0 660 140 | 6/1995 |
| EP | 0 665 588 A1 | 8/1995 |
| EP | 0 703 609 | 3/1996 |
| EP | 0 793 263 A2 | 9/1997 |
| EP | 0 801 419 A1 | 10/1997 |
| EP | 0 807 970 A1 | 11/1997 |
| EP | 0 849 788 A2 | 6/1998 |
| EP | 0 889 509 A2 | 1/1999 |
| EP | 0 898 307 | 2/1999 |
| EP | 0 917 193 A1 | 5/1999 |
| EP | 0 938 129 A1 | 8/1999 |
| EP | 0 902 843 B1 | 3/2000 |
| EP | 0 989 593 A2 | 3/2000 |
| EP | 0 994 503 A1 | 4/2000 |
| EP | 1 050 901 A2 | 11/2000 |
| EP | 1 059 663 A2 | 12/2000 |
| EP | 0 754 953 B1 | 6/2001 |
| EP | 0 717 437 B1 | 4/2002 |
| EP | 0 786 801 A1 | 6/2003 |
| FR | 2 558 263 A1 | 7/1985 |
| FR | 2 671 472 A1 | 7/1992 |
| FR | 2 681 472 A1 | 3/1993 |
| FR | 95 08882 | 7/1995 |
| FR | 2 725 074 | 3/1996 |
| FR | 2 736 934 A1 | 1/1997 |
| FR | 2 748 850 A1 | 11/1997 |
| FR | 2 748 851 | 11/1997 |
| FR | 2 758 907 A1 | 7/1998 |
| FR | 2 767 416 A1 | 2/1999 |
| FR | 2 767 604 | 2/1999 |
| FR | 2 771 852 A1 | 6/1999 |
| FR | 2 773 261 | 7/1999 |
| FR | 2 774 510 A1 | 8/1999 |
| FR | 2 781 925 A1 | 2/2000 |
| FR | 2 796 491 | 1/2001 |
| FR | 2 797 347 A1 | 2/2001 |
| FR | 2 809 867 | 12/2001 |
| FR | 2 819 099 A1 | 7/2002 |
| GB | 2 211 991 A | 7/1989 |
| JP | 53-104156 | 9/1978 |
| JP | 58 31519 | 2/1983 |
| JP | 59-54217 | 3/1984 |
| JP | 62265717 | 11/1987 |
| JP | 101004013 | 1/1989 |
| JP | 08017777 | 1/1990 |
| JP | 4199504 | 7/1992 |
| JP | 07-254690 | 10/1995 |
| JP | 7-302889 | 11/1995 |
| JP | 8133878 | 5/1996 |
| JP | 09-213594 | 8/1997 |
| JP | 09-307719 | 11/1997 |
| JP | 10163166 | 6/1998 |
| JP | 10233352 | 9/1998 |
| JP | 11045862 | 2/1999 |
| JP | 11074208 | 3/1999 |
| JP | 11087668 | 3/1999 |
| JP | 11-145436 | 5/1999 |
| JP | 11317577 | 11/1999 |
| RU | 128757 | 6/2000 |
| WO | WO 95/20824 A1 | 8/1995 |
| WO | WO 99/08316 A1 | 2/1999 |
| WO | WO 99/35674 A1 | 7/1999 |
| WO | WO 99/39378 A1 | 8/1999 |
| WO | WO 00/48238 A1 | 8/2000 |
| WO | WO 00/63965 A1 | 10/2000 |
| WO | WO 01/11930 A2 | 2/2001 |
| WO | WO 01/43168 A2 | 6/2001 |
| WO | WO 02/05344 A1 | 1/2002 |
| WO | WO 02/47156 A1 | 6/2002 |
| WO | WO 02/083387 A1 | 10/2002 |
| WO | WO 03/013815 A1 | 2/2003 |

OTHER PUBLICATIONS

Aspar et al., "The Generic Nature of the Smart-Cut® Process for Thin-film Transfer", Journal of Electronic Materials, vol. 30, No. 7, pp. 834-840, 2001.

Diem et al., "SOI 'SIMOX'; from bulk to surface micromachining, a new age for silicon sensors and actuators", Sensors and Actuators, vol. A 46-47, pp. 8-16, 1995.

Goesele et al., "Semiconductor Wafer Bonding", Science and Technology, ECS Series, New Jersey 1999, Annual Review of Material Science, vol. 28, pp. 215-241, 1998.

Liu et al., "Investigation of Interface in Silicon-on-Insulator by Fractual Analysis," Applied Surface Science, 187, pp. 187-191, 2002.

Schnell et al., "Plasma Surface Texturization for Multicrystalline Silicon Solar Cells", IEEE, XXVIII$^{th}$ Photovoltaic Conference, pp. 367-370, 2000.

Mastrangelo, C.H., "Suppression of Stiction in MEMS", Proceedings of the Materials Research Society Seminar, vol. 605, pp. 1-12, 2000.

Yee et al., "Polysilicon Surface-Modification Technique to Reduce Sticking of Microstructures," Sensors and Actuators A 52, pp. 145-150, 1996.

Fujitsuka et al., "A new processing technique to prevent stiction using silicon selective etching for SOI-MEMS", Sensors and Actuators, A97-98, pp. 716-719, 2002.

Ashurst et al., "Wafer level anti-stiction coatings for MEMS", Sensors and Actuators A104, pp. 213-221, 2003.

Agarwal et al, "Efficient Production of Silicon-On-Insulator Films by Co-Implantation of HE+ with H+", Applied Physics Letters, vol. 72, No. 9, 1988, pp. 1086-1088.

Agarwal, Aditya et al. "Efficient Production of Silicon-On-Insulator Films by Co-Implantation of He$^+$ with H$^{+}$"—Proceedings 1997 IEEE International SOI Conference, Oct. 1997—pp. 44-45.

Ahn, K. Y., et al., "Growth, Shrinkage, and Stability of Interfacial Oxide Layers Between Directly Bonded Silicon Wafers", Applied Physics A., vol. 50, 1990, pp. 85-94.

Almedia et al. "Bond formation in ion beam synthesized amorphous gallium nitride", Elsevier, This Solid Films, 343-344 1999, pp. 632-636.

Ascheron, C., "A Comparative Study of Swelling, Radiation, Strain and Radiation Damage of High-Energy Proton-bombarded GaAs, GaP, InP, SI and Ge Single Crystals, Nuclear Instruments and Methods in Physics Research", Nuclear Instruments and Methods in Physics Research B36, (1989), 1637172.

Ascheron, C., "A Study of Proton Bombardment Induced Swelling of GaP Single Crystals", Phys. stat. sol. (a) 92, (1985), pp. 169.

Ascheron, C., "Gettering a Copper in Proton-and Helium-Bombarded Buried Regions of Gallium Phosphide", Phys. stat. sol. (a), vol. 106, 1988, pp. 73-79.

Ascheron, C., "Investigations of Hydrogen Implanted GaP Single Crystals by Means of Particle Induced 7-Spectroscopy, Infrared Spectroscopy, and Turyherford Backscattering Channeling Technique" Phys. stat. sol. (a) 89, (1985), pp. 549.

Ascheron, C., "Proton Beam Modification of Selected AIIIBV Compounds", Phys. stat. sol. (a) 124, (1991), pp. 11.

Ascheron, C. et al, "Proton Bombardment Induced Swelling of GaP", 1985, pp. 169-176.

Ascheron, C., "Swelling, Strain, and Radiation Damage of He+ Implanted GaP", Phys. stat. sol. (a) 96, 1986, pp. 555-562. (1986).

Asheron, C., "The Effect of Hydrogen Implantation Induced Stress on GaP Single Crystals", Nuclear Instruments and Methods in Physics Research, B28 (1987), pp. 350-359.

Aspar et al., Smart-Cut®: The basic fabrication process for UNIBOND® SOI wafers, SEMI 1996, pp. 37-46.

Aspar et al., U.S. Appl. No. 09/777,516, also Pub. No. US 2001/0007789 A1 with allowed claims, Published Jul. 12, 2001.

Aspar, B. "Basic Mechanisms Involved in the Smart-Cut Process", 1997, pp. 223-240.

Aspar, B. et al, "Characterization of SOI substrates: Application to Recent SIMOX and UNIBOND Wafers," Electrochemical Society Proceedings, vol. 96-3, pp. 99-111.

Aspar, B. et al, "Transfer of Structured and Patterned Thin Silicon Films Using the Smart-Cut Process", 1996, pp. 1985-1986.

Aspar, B. Et al., "Ultra Thin Buried Oxide Layers Formed by Low Dose SIMOX Processes", Proc. 6th International Conference on SOI Technology and Devices, *Electro. Soc.*, vol. 94, No. 11, 1994, pp. 62.

Aspar, B. et al., "Smart Cut—Process Using Metallic Bonding: Application to Transfer of Si, GaAs, InP Thin Films", Electronic Letters—Jun. 10, 1999, vol. 35, No. 12., pp. 1024-1025.

Auberton-Herve, A. J. et al, "A New Sal Material: Smart-Cut", 1996, pp. 214-219.

Auberton-Herve, A.J. et al, "SOI Materials for ULSI Applications", *Semiconductor International*, Oct. 1995, 5 pps.

Blanchard-Lagahe C. et al., "Hydrogen and Helium Implantation to Achieve Layer Transfer" vol. 19, pp. 346-358, 2003, *Semiconductor Wafer Bonding VII: Science, Technology, and Applications—Proceedings of the International Symposium.*

Blöchl P.E. et al., First-Principles Calculations of Diffusion Coefficients: Hydrogen in Silicon, *Physical Review Letters*, vol. 64, No. 12, 1990, pp. 1401-1404.

Borgati, Stephen P., "The Root-Mean-Square", Boston College, Nov. 16, 1998, Obtained from the Internet at: <http://www.analytictech.com/mb313/rootmean.htm>.

Bruel, M. et al., (vol. 99-1) Meeting Abstract No. 333, "Single Crystal Semiconductor Layer Delamination and Transfer Through Hydrogen Implantation", The 195th Meeting of the Electrochemical Society, May 2-6, 1999, Seattle, Washington.

Bruel, Michel, "Application of Hydrogen Ion Beams to Silicon on Insulator Material Technology", *Nuclear Instruments and Methods in Physics Research*, B108, 1996, pp. 313-319.

Bruel, M. et al., "Smart-Cut: A New Silicon on Insulator Material Technology Based on Hydrogen Implantation and Wafer Bonding", 1997, pp. 1636-164, col. 36, Part 1, No. 3B.

Bruel, M. "Smart-Cut Process: The Way to Unibond S.O.I. Wafers", 1996, pages unknown.

Bruel, M. et al, "Smart-Cut": A Promising New SOI material technology, *Proceedings 1994 IEEE, International Sal Conference*, Oct. 1995, pp. 178-179.

Bruel, M. et al, "Smart-Cut—a new SOI Material Technology based on hydrogen Implantation and wafer bonding," *CEA*, 1996, 24 pages.

Bruel, M., "Silicon on insulator Material Technology", *Electronic Letters*; 31 Jul. 6, 1995; No. 14; pp. 1201-1202.

Bruel, M., "Silicon-an-Insulator", *European Semiconductor*, Mar. 1997.

Camperi-Ginestet et al., "Alignable Epitaxial Liftoff of GaAs Materials With Selective Deposition Using Polyimide Diaphragms", *IEEE Transactions Photonics Technology Letters*, vol. 3, No. 12, 1991, pp. 1123-1126.

Canham et al. "Radiative Recombination Channels due to Hydrogen in Crystalline Silicon", *Materials Science and Engineering*, B4 (1989) pp. 41-45.

Carter et al., "Applications of Ion Beams to Materials", *Inst. Phys. Conf. Ser.*, No. 28, Chapter 1, 1976, pp. 30-36.

Carter, G. et al., The Collection of Ions Implanted in Semiconductors: II Range Distributions Derived From Collection and Sputter-Etch Curves, *Radiation Effects*, 1972, vol. 16, pp. 107-114.

Cassidy, Victor M., "Ion Implantation Process Toughens Metalworking Tools," *Modern Metals*, 1984, pp. 65-67.

Cerofolini et al., "Hydrogen-Related Complexes as the Stressing Species in High-Fluence, Hydrogen-Implanted, Single-Crystal Silicon" *Physical Review B*, vol. 46, No. 4, 1992, pp. 2061-2070.

Cerofini et al., "Ultradense Gas Bubbles in Hydrogen-or-Helium-Implanted (or Co-Implanted) Silicon", *Materials Science and Engineering*, B71, 2000, pp. 196-202.

Cerofolini et al., "Hydrogen and Helium Bubbles in Silicon", *Material Science and Engineering 2000*—Reports: A Review Journal, Published by Elsevier Science S.A. 2000, pp. 1-52.

Chu et al, "Radiation Damage of 50-250 keV Hydrogen Ions in Silicon", *Ion Implantation in Semiconductors*, eds. F. Chernob et al., Plenum New York 1976, pp. 483-492.

Chu, et al. "Ion Implantation in Semiconductors", Chernow, Borders and Brice, Pirnum Press, New York and London. Radiation Damage of 50-250 keV Hydrogen Ions in Silicon, 1976, pp. 483-891.

Chu, P.K. et al., "Plasma Immersion Ion Implantation—A Fledgling Technique for Semiconductor Processing, Materials Science and Engineering Reports", *A Review Journal*, vol. R17, Nos. 6-7, Nov. 30, 1996, pp. 207-280.

Cowern, N. et al., "Transport Diffusion of Ion-Implanted B in Si: Dose, Time, and Matrix Dependence of Atomic and Electrical Profiles", *J. Appl. Phys.*, vol. 68, No. 12, 1990, pp. 6191-6198.

Cristoloveanu, S. et al, "Electrical Properties of Unibond Material", *Electrochemical Society Proceedings*, vol. 96-3, pp. 142-147.

Csepregl, L. et al. "Regrowth Behavior of Ion-Implanted Amorphous Layers on <111> Silicon", *Applied Physics Letters*, vol. 2, 1976, pp. 92-93.

Cullis, A.G. et al. "Comparative study of annealed neon-, argon-, and krypton-ion implantation damage in silicon," *J. Appl. Phys.*, 49(10), Oct. 1978, pp. 5188-5198.

Demeester, et al., "Epitaxial Lift-Off and Its Applications", *Semicond. Sci. Technol.*, vol. 8, 1993, pp. 1124-1135.

Denteneer, P. et al., Hydrogen Diffusion and Passivation of Shallow Impurities in Crystalline Silicon, *Materials Science Forum*, Trans Tech Publications, Switzerland, vols. 38-41, 1989, pp. 979-984.

Denteneer, P. et al., "Structure and Properties of Hydrogen-Impurity Pairs in Elemental Semiconductors", *Physical Review Letters*, vol. 62, No. 16, 1989, pp. 1884-1888.

DiCioccio, et al.,"Silicon carbide on Insulator formation using the Smart Cut process", *Electronics Letters*, vol. 32, No. 12, Jun. 6, 1996, pp. 144-145.

Dirks, A. G. et al., "Columnar Microstructure in Vapor DEuropesited Thin Films", *Thin Solid Films*, vol. 47, 1977, pp. 219-233.

Duo, et al., "Comparison Between the different Implantation orders in H+ and He+ Co-implantation", *J. Phys. D. Appl. Phys.* vol. 34, 2001, pp. 477-482.

Duo, et al., "Evolution of Hydrogen and Helium Co-Implanted Single-Crystal Silicon During Annealing", 2001 American Institute Physics—Journal of Applied Physics, vol. 90, No. 8, Oct. 15, 2001, pp. 3780-3786.

Eaglesham, White, Feldman, Moriya and Jacobson, "Equilibrium Shape of Si," *Physical Review Letters*, vol. 70, No. 11, Mar. 15, 1993, pp. 1643-1646.

EerNisse, E., "Compaction of ion-implanted fused silica", *Journal of Applied Physics*, vol. 45, No. 1, Jan. 1974.

EerNisse, E.P., "Role of Integrated Lateral Stress in Surface Deformation of He-Implanted Surfaces" *Journal of Applied Physics*, vol. 48, No. 1, Jan. 1977, pp. 9-17.

Evans, J.H., "An Interbubble Fracture Mechanism of Blister Formation on Helium-Irradiated Metals" *Journal of Nuclear Materials*, 68, 1977, pp. 129-140.

Feijoo et al., "Prestressing of Bonded Wafers", vol. 92-7, 1992, pp. 230-238.

Feng et al., "Generalized Formula for Curvature Radius and Layer Stresses Caused by Thermal Strain in Semiconductor Multilayer Structures", *J. Appl. Phys.*, vol. 54, No. 1, 1983, pp. 83-85.

Garnier, D. M., "The Fabrication of a Partial Soi Substrate", Proceedings of the 9th International Symposium on Silicon on Isolator Technology and Devices, vol. 99, Chap. 54, 1990, 73-78.

Gerasimenko, N., "Infrared Absorption of Silicon Irradiated by Protons", *Phys. stat.sol.* (b) 90, (1978), pp. 689-695.

Ghandi, Sorab, "VLSI Fabrication Princiles-Silicon and Gallium Arsenide", *Rensselaer Polytechnic Institute*, 1983, John Wiley & Sons publishers, pp. 135.

Greenwald, A.C., "Pulsed-electron-beam annealing of ion-implantation damage", *J. Appl. Phys.* 50(2), Feb. 1978, pp. 783-786.

Grovenor, C.R.M., *Microelectronic Materials*, pp. 73-75 (1989).

Guilhalmenc, C. et al, "Characterization by Atomic Force Microscopy of the SOI Layer Topography in Low Dose SIMOX Materials", *Materials Science and Engineering*, B46, 1997, pp. 29-32.

Haisma et al., Silicon-on-Insulator Wafer Bonding-Wafer Thinning Technological Evaluations, *JAPANese Journal of Applied Physics*, Aug. 28, 1989, No. 8, Part 1, Tokyo, Japan, pp. 1426-1443.

Hamaguchi et al., "Device Layer Transfer Technique using Chemi-Mechanical Polishing", *JAPANese Journal of Applied Physics*, 23,(Oct. 1984), No. 10, Part 2, Tokyo, Japan, pp. L815-L817.

Hamaguchi et al., "Novel LSI/SOI Wafer Fabrication Using Device Layer Transfer Technique", *Proc. IEDM*, 1985, pp. 688-691.

Henttinen et al., "Mechanically Induced Si Layer Transfer if Hydrogen-Implanted Si-Wafers", *American Institute of Physics*, vol. 76, No. 17, 2000, pp. 2370-2372.

Hulett, D.M. et al., "Ion Nitriding and Ion Implantation: A Comparison," *Metal Progress*, 1985, pp. 18-21.

IBM Technical Disclosure Bulletin, *Isolation by Inert Ion Implantation*, 1986, vol. 29 No. 3, pp. 1416.

IBM Technical Disclosure Bulletin, *SOI Interposer Structure XP 000627972*, Jul. 1996, vol. 39 No. 7, pp. 1-5.

Japanese Office Action dated Oct. 25, 2007 for JAPANese Patent Application No. 2002-581572.

Jaussaud, C. et al., Microstructure of Silicon Implanted With High Dose Oxygen Ions, *Appl. Phys. Lett.*, vol. 48, No. 11, 1985, pp. 1064-1066.

Johnson, "High Fluence Deuteron Bombardment of Silicon", *Radiation Effects*, vol. 32, pp. 159-167.

Jones, K. S. et al., "A Systematic Analysis of Defects in Ion Implanted Silicon", *Applied Physics A.*, vol. 45, 1988 pp. 1-34.

Jones et al., "Enhanced elimination of implantation damage upon exceeding the solid solubility", *J. App. Phys.*, vol. 62, No. 10, 1987, pp. 4114-4117.

Kamada et al, Observation of Blistering and Amorphization on Germanium Surface After 450 keV Ar+ION Bombardment, *Radiation Effects*, vol. 28, 1976, pp. 43-48.

Klem, J.F., "Characteristics of Lift-Off Fabricated AlGaAs/InGaAs Single-Strained-Quantum Well Structures on Glass and Silicon Substrates", *Inst. Phys. Conf.* Ser. No. 96: Chapter 6, (1989), pp. 387-392.

Komarov et al., Crystallographic Nature and Formation Mechanisms of Highly Irregular Structure in Implanted and Annealed S1, Layers*Radiation Effects*, vol. 42, 1979, pp. 169-178.

Kucheyev et al., "Ion Implantation Into GaN", *Materials Science and Engineering*, vol. 33, 2001, pp. 51-107.

Laporte A. et al., "Charged Defects At the Interface Between Directly Bonded Silicon Wafers"—Applied Physics, vol. 36 (Sep. 1997) pp. 5502-5506—Part 1, No. 9A.

Li, J., "Novel Semiconductor Substrate Formed by Hydrogen Ion Implantation into Silicon," Appl. Phys. Lett., vol. 55, No. 21, Nov. 20, 1989, pp. 2223-2224.

Ligeon, E., "Hydrogen Implantation in Silicon Between 1.5 and 60 KeV", *Radiation Effects 1976*, vol. 27, pp. 129-137.

Liu et al. "Ion Implantation in GaN At Liquid-Nitoigen Temperature: Structural Characteristics and Amorphization", *Physical Review B of The American Physical Society*, vol. 57, No. 4, 1988, pp. 2530-2535.

Lu, X., et al., "SOI Material Technology Using Plasma Immersion ION Implantation", Proceedings 1996 IEEE International SOI Conference, Oct. 1996, pp. 48-49.

Maleville, C. et al., "Physical Phenomena involved in the Smart-Cut Process", *Electrochemical Society Proceeding*, vol. 96-3, 1996—pp. 34-46.

Maleville, C. et al, "Wafer Bonding and Hi-Implantation Mechanisms Involved in the Smart-Cut Technology", 1997, pp. 14-19.

Manuaba, A., "Comparative Study on Fe32Ni36CrI4P12B 6 Metallic Glass and its Polycrystalline Modification bombarded by 2000 keV Helium Ions with High Fluence" *Nuclear Instruments and Methods*, (1982) pp. 409-419.

Matsuda et al., "Large Diameter Ion Beam Implantation System," *Nuclear Instruments and Methods*, vol. B21, 1987, pp. 314-316.

Matsuo et al., "Abnormal solid solution and activation behavior in GA-implanted Si(100)", *Appl. Phys. Lett.*, vol. 51, No. 24, 1987, pp. 2037-2039.

Mishima, Y. and T. Yagishita, T. "Investigation of the bubble formation mechanism in a-Si:H films by Fourier-transform infrared microspectroscopy" *J. Appl. Phys.*, vol. 64, No. 8, Oct. 15, 1988, pp. 3972-3974.

Miyagawa, S. et al, "Helium Reemission During Implantation of Silicon Carbide", 1982, pp. 2302-2306.

Miyagawa, S., "Surface structure of silicon carbide Irradiated with helium ions with mono energy and continuous energy distributions" *J. Appl. Phys.* 53(12), Dec. 1982, pp. 8697-8705.

Monemar, B. "Shallow Impurities in Semiconductors 1998", Proceedings of the Third International Conference in Sweden, Aug. 10-12, 1988, No. 95, pp. 493-499.

Moreau, Wayne M., "Semiconductor Lithography, Principles, Practices, and Materials," Plenum Press, 1988. Table of Contents only.

Moriceau, H. et al, A New Characterization Process Used to Qualify SOI Films 1991 pp. 173-178.

Moriceau, H. et al, "A New Characterization Process Used to Qualify SOI Films", 1991 pp. 173-178.

Moriceau, H. et al. "Cleaning and Polishing as Key Steps for Smart-Cut SOI Process", Proceedings 1996 IEEE SOI Conference, Oct. 1996.

Moriceau, H. et al, "The Smart-Cut Process as a Way to Achieve Specific Film Thickness in Sal Structures", 1997, pages unknown.

Moriceau et al., (vol. 99-1) Meeting Abstract No. 405, "A New Characterization Process Used to Qualify SOI Films", The 195$^{th}$ Meeting of the Electrochemical.Society, May 2-6, 1999, Seattle, Washington.

Munteanu, D. et al, "Detailed Characterization of Unibond Material", 1997, pp. 395-398.

Myers, D. R., "The effects of Ion-Implantation damage on the first order Raman spectra GaPa)" *J. Appl. Phys.* 54(9), Sep. 1977.

Nethling. J. et al, "Identification of Hydrogen Platelets in ProtonBombarded GaAs", 1985, pp. 941-945.

Nichols C. S et al., "Properties of Hydrogen in Crystalline Silicon Under Compression and Tension", *Physical Review Letters*, vol. 63, No. 10, 1989, pp. 1090-1093.

Nicoletti, S. et al., "Bi-Epitaxial YBCO Grain Boundry Josephson Junctions on SrTiO3 and Sapphire Substrates", *Physics C269*, 1996, pp. 255-267.

Office Action (Non-Final) for U.S. Appl. No. 10/468,223—Dated Oct. 5, 2005 (15).

Office Action (Final) for U.S. Appl. No. 10/468,223—Dated May 3, 2006 (15).

Office Action (Non-Final) for U.S. Appl. No. 10/468,223—Dated Jan. 10, 2007 (15).

Office Action (Final) for U.S. Appl. No. 10/468,223—Dated Jul. 20, 2007 (15).

Office Action (Non-Final) for U.S. Appl. No. 10/468,223—Dated Feb. 11, 2008 (15).

Office Action (Final) for U.S. Appl. No. 10/468,223—Dated Oct. 29, 2008 (15).

Office Action (Non-Final) for U.S. Appl. No. 10/468,223—Dated Jun. 25, 2009 (15).

Office Action (Non-Final) for U.S. Appl. No. 10/474,984—Dated Sep. 24, 2004 (16).

Office Action (Non-Final) for U.S. Appl. No. 10/474,984—Dated Jun. 6, 2005 (16).

Office Action (Non-Fina ) for U.S. Appl. No. 10/474,984—Dated Nov. 16, 2005 (16).

Office Action (Non-Final) for U.S. Appl. No. 10/474,984—Dated May 17, 2006 (16).

Office Action (Non-Final) for U.S. Appl. No. 10/474,984—Dated May 7, 2007 (16).

Office Action (Non-Final) for U.S. Appl. No. 10/474,984—Dated Feb. 6, 2008 (16).

Office Action (Final) for U.S. Appl. No. 10/474,984—Dated Oct. 17, 2008 (16).

Office Action (Non-Final) for U.S. Appl. No. 10/474,984—Dated Jul. 7, 2009 (16).

Office Action (Non-Final) for U.S. Appl. No. 10/540,303—Dated Dec. 18, 2007 (30).

Office Action (Non-Final) for U.S. Appl. No. 10/561,299—Dated Mar. 26, 2008 (34).

Office Action (Final) for U.S. Appl. No. 10/561,299—Dated Dec. 9, 2008 (34).

Office Action (Final) for U.S. Appl. No. 10/561,299—Dated May 11, 2009 (34).

Office Action (Final) for U.S. Appl. No. 10/561,299—Dated Nov. 16, 2009 (34).

Office Action (Non-Final) for U.S. Appl. No. 10/561,299—Dated Nov. 27, 2009 (34).

Office Action (Final) for U.S. Appl. No. 10/561,299—Dated May 11, 2010 (34).

Ono et al., "Orientation Dependence of Flaking of Ion Irradiated Aluminum Single Crystals", *Japanese Journal of Applied Physics*, vol. 25, No. 10, 1986, pp. 1475-1480.

Paszti, E, "Flaking and Wave-Like Structure on Metallic Glasses Induced by MeV-Energy Helium Ions", *Nuclear Instruments and Methods*, vol. 209/210, (1983), pp. 273-280.

Picraux, S. Thomas et al., "Ion Implantation of Surfaces," *Scientific American*, vol. 252, No. 3, pp. 102-113 1985.

Pollentier, et al., "Fabrication of High-Radiance LEDs by Epitaxial Lift-Off", *SPIE*, vol. 1361, 1990, pp. 1056-1062.

Popov, V.P. et al., "Blistering on a Silicon Surface in the Process of Sequential Hydrogen/Helium ION Co-(plantation)"—Optoeleciron-ics Instrumentation and Data Processing, No. 3, Apr. 5, 2001—pp. 90-98—2001.

Primak, W., "Impurity Effect in the Ionization Dilation of Vitreous Silica" *J. Appl. Phys.* 39(13) 1968.

Reissue U.S. Appl. No. 10/449,786.

Renier, M. et al., "A New Low-Energy Ion Implanter for Bombardment of Cylindrical Surfaces," *Vacuum*, vol. 35, No. 12, pp. 577-578, 1985.

Roth, J., "Blistering and Bubble Formation" *Inst. Phys. Conf.* Ser. No. 28, 1976: Chapter 7, pp. 280-293.

Sah, Chih-Tang et al., "Deactivation of the Boron Acceptor in Silicon by Hydrogen," *Appl. Phys. Lett.* 43, (2), Jul. 1983, pp. 204-206.

Saint-Jacques R. G., "La Formation des Cloques, *Nuclear Instruments and Methods*, No. 209/210", North Holland Publishing Co., 1983, pp. 333-343.

Shintani, A. et al., "Temperature dependence of stresses in chemical deposited vitreous films", *J. Appl. Phys.*, vol. 51, No. 8, 1980, pp. 4197.

Silicon-On-Insulator, *European Semiconductor*, Mar. 1997, pp. 17 and 18.

Sioshansi, Piran, "Ion Beam Modification of Materials for Industry," *Thin Solid Film*, vol. 118, 1984, pp. 61-71.

Snyman, H. C., "Transmission Electron Microscopy of Extended Crystal Defects in Proton Bombarded and Annealed GaAs", *Radiation Effects*, 1983, vol. 69, pp. 199-230.

Snyman, H. C. et al, "Void Formation in Annealed Proton-Bombarded GaAs", 1981, pp. 243-245.

Stein, Myers and Follstaedt, "Infrared Spectroscopy of chemically bonded hydrogen at voids and defects in silicon", *J. Appl. Phys.* 73(b6), Mar. 15, 1993, pp. 2755-2764.

Stephen, D., "Investigation of Lattice Strain in Proton-Irradiated GaP by a Modified Auleytner Technique" *Phys. stat. sol.* (a) 87, 1985, pp. 589-596.

Sunkara et al., "Bulk synthesis of silicon nanowires using a low-temperature vapor-liquid-solid solution", *Applied Physics Letters*, vol. 79, No. 10, Sep. 3, 2001, pp. 1546-1548.

Suzuki et al., "High-Speed and Low Power n+—p+ Double-Gate SOI CMOS", *IEICE Trans. Electron.*, vol. E78-C, No. 4, 1995, pp. 360-367.

Sze, S.M., VlLSI Technology, 2.sup.nd Ed., 1988, pp. 9-10.

Tan, T. Y. et al., "On Oxygen Precipitation Retardation/Recovery Phenomena, Nucleation Incubation Phenomena and the Exigent-Accomodation-Volume Factor of Precipitation", Proceedings of the 5th International Symposium on Silicon Materials Science and Technology, *Semiconductor Silicon 198 Electrochem. Soc.*, New Jersey, 1986, pp. 864-873.

Terada, K. et al., "A New Dram Cell With a Transistor on a Lateral Epitaxial Silicon Layer (Tole Cell)", *IEEE Transactions on Electron Device*, vol. 37, No. 9, 1990, pp. 2052-2057.

Terreault, Bernard, "Hydrogen Blistering of Silicon: Progress in Fundamental Understanding", *Phys. Stat. Sol.* (a) 204, No. 7, 2007, pp. 2129-2184.

Theodore, N. David et al., TFSOI With Improved Oxidation Resistance (To Reduce Isolation Induced Stresses and Leakage), Motorola Bulletin XP 000691920, *Technical Developments*, Nov. 1996, pp. 158-159.

Timoshenko, S. et al., "Analysis of Bi-Metal Thermostats", *J. Opt. Soc. Am.*, vol. 11, 1925, pp. 233-256.

Tong et al., "Low Temperature SI Layer Splitting", Proceedings 1997 IEEE International SOI Conference, Oct. 1997, pp. 126-127.

Tonini, Monelli, Cornl, Ottaviani, Frabboni, Canteri, Queirolo, "Hydrogen Interaction with phosphorus ion implantated silicon", *Ion Implantation Technology-94*, (1995) pp. 801-804.

Tzeng, J.C., "A Novel Self-Aligned Oxgyen (Salox) Implanted SOI Mosfet Device Structure" *Nuclear Instruments and Methods in Physics Research* B2, 1987, pp. 112-115.

U.S. Dept. of Energy, "The Fusion Connection: Contributions to Industry, Defense, and Basic Science Resulting From Scientific Advances Made in the Magnetic Fusion Energy Program", *Plasma Coating*, pp. 6-7, 1985.

Van de Walle, C. "Structural Identification of Hydrogen and Muonium Centers in Silicon First Principles Calculations of Hyperfine Parameters", *Physical Review Letters*, vol. 60, No. 26, 1988, pp. 2761-2764.

Van de Walle, C. "Theoretical Aspects of Hydrogen in Crystalline Semiconductors", *Physica B*, Holland, vol. 170, No. 15, 1991, pp. 21-32.

Van de Walle, C. "Theory of Hydrogen Diffusion and Reactions in Crystalline Silicon", *Physical Review Letters*, vol. 64, No. 6, 1980, pp. 669-672.

Van de Walle, C. "Theory of Hydrogen Diffusion and Reactions in Crystalline Silicon", *Physical Review B*, vol. 39, No. 15, 1989, pp. 10 791-10 808, plus diagrams.

Van Swijgenhoven et al. "Helium Bubble and Blister Formation for Nickel and an AMorphous Fe-Ni-Mo-B Alloy During 5 key He-+-Irradiation at Temperatures Between 200 K and 600", *Nuclear Instruments and Methods*, 209/210, 1983, pp. 461-468.

Veldkamp, W.B. et al., "Binary Optics," *Scientific American*, 1992, pp. 50-55.

Venezia et al., "The Role of Implantation Damage in the Production of Silicon-On-Insulator Films by Co-Implantation of $He^+$ and $H^{+}$", *Electrochemical Society Proceedings* vol. 98-1, 1998—pp. 1384-1395.

Weldon et al., "Mechanism of Silicon Exfoliation Induced by Hydrogen/Hekium Co-implantation", *Applied Physics Letters*, vol. 73, No. 25, pp. 3721-3723, Dec. 21, 1998.

Wemple, S.H., "Optical and channeling studies of ion-bombarded GaP", *J. Appl. Phys.*, vol. 45, No. 4, Apr. 1974, pp. 1578-1588.

Whitton, J. L. et al., "The Collection of Ions Implanted in Semiconductors: 1 Saturations Effects", *Radiation Effects*, Scotland, vol. 16, 1972, pp. 101-105.

Wiegand, M. et al., "Wafer Bonding of Silicon Wafers Covered With Various Surface Layers", *Sensors and Actuators*, Elsevier Science B.V., vol. 86, 2000, pp. 91-95.

Williams J. et al., "Annealing behaviour of high-dose rare-gas implantations into silicon", from Application of Ion Beans to Materials, 1975, Chap. 1, *Inst. Phys. Conf.* Ser. No. 28, 1976, pp. 30-36.

Wittmaack et al., "High Fluence Retention of Noble Gases Implanted in Silicon" *Radiation Effects*, vol. 39, 1978, pp. 81-95.

Wolf, Stanley Ph.D., Silicon Processing for the VLSI Era (vol. 2), Lattice Press, 1990, pp. 66-79.

Wong et al., "Integration of GaN Thin Films With Dissimilar Substrate Materials by Pd-In Metal Bonding and Laser Lift-Off", Journal of Electronic Materials, vol. 28, No. 12, 1999, pp. 1409-1413.

Yamaguchi H. et al., "Intelligent Power IC With Partial Soi Structure", *Jpn. J. Appl. Phys.*, vol. 34, 1995, pp. 864-868.

Yun et al., "Fractional Implantation Area Effects on Patterned Ion-Cut Silicon Layer Transfer", Dept. of Electrical Eng, and Computer Sciences, University of California, Berkley, CA, 94720, USA, 1999 IEEE International SOI Conference, Oct. 1999, pp. 129-130.

Yun et al., "Thermal and Mechanical Separations of Silicon Layers From Hydrogen Pattern-Implanted Wafers", *Journal of Electronic Materials*, vol. 38, No. 8, Apr. 24, 2001, pp. 960-964.

Yun, H. et al., "Transfer of Patterned Ion-Cut Silicon Layers", *Applied Physics Letters*, vol. 73, No. 19, 1998, pp. 2772-2774.

U.S. District Court District of Delaware (Wilmington) Civil Docket for Case #: 1:08-cv-00292-SLR—(54 pgs).

Complaint filed with Jury Demand against MEMC Electronic Materials Inc.—Magistrate Consent Notice to Pltf. ( Filing fee $ 350, receipt No. 152004.)—filed by SOITEC Silicon on Insulator Technologies SA, Commissariat a LEnergie Atomique. (Attachments: # 1

Exhibit 1, # 2 Exhibit 2, # 3 Exhibit 3, # 4 Civil Cover Sheet, # 5 Acknowledgement of Consent Form) (sns, ) (Entered: May 20, 2008) (47 pgs).
Notice of Availability of a U.S. Magistrate Judge to Exercise Jurisdiction (sns, ) (Entered: May 20, 2008) (1 pg).
Report to the Commissioner of Patents and Trademarks for Patent/Trademark Nos. RE39,484 E; 6,809,009; 7,067,396 B2; (sns, ) (Entered: May 20, 2008) (1 pg).
Summons Returned Executed by SOITEC Silicon on Insulator Technologies SA, Commissariat a LEnergie Atomique. MEMC Electronic Materials Inc. served on May 19, 2008, answer due Jun. 9, 2008. (Kraft, Denise) (Entered: May 20, 2008) (2 pgs).
Motion for Pro Hac Vice Appearance of Attorney George W. Neuner, Alan M. Spiro, Brian M. Gaff and Carolyn D'Agincourt—filed by SOITEC Silicon on Insulator Technologies SA, Commissariat a LEnergie Atomique. (Attachments: # 1 Certificate of Compliance Certification by Counsel to Be Admitted Pro Hac Vice, # 2 Certificate of Compliance Certification by Counsel to Be Admitted Pro Hac Vice, # 3 Certificate of Compliance Certification by Counsel to Be Admitted Pro Hac Vice, # 4 Certificate of Compliance Certification by Counsel to Be Admitted Pro Hac Vice, # 5 Certificate of Service)(Kraft, Denise) (Entered: May 23, 2008) (6 pgs).
Stipulation to Extend Time Answer to Complaint to Jul. 9, 2008—filed by MEMC Electronic Materials Inc.. (Rogowski, Patricia) (Entered: Jun. 5, 2008) (1 pg).
Motion for Pro Hac Vice Appearance of Attorney Robert M. Evans, Jr., David W. Harlan, Richard L. Brophy, Marc W. Vander Tuig—filed by MEMC Electronic Materials Inc.. (Attachments: # 1 Certification of Robert M. Evans, Jr., # 2 Certification of David W. Harlan, # 3 Certification of Richard L. Brophy, # 4 Certification of Marc W. Vander Tuig)(Rogowski, Patricia) (Entered: Jun. 9, 2008) (6 pgs).
Motion for Pro Hac Vice Appearance of Attorney Michael L. Brody, Richard P. Gilly, Gail J. Standish, Marcus T. Hall and Jason S. Charkow—filed by SOITEC Silicon on Insulator Technologies SA. (Attachments: # 1 Certification by Counsel to be Admitted Pro Hac Vice, # 2 Certification by Counsel to be Admitted Pro Hac Vice, # 3 Certification by Counsel to be Admitted Pro Hac Vice, # 4 Certification by Counsel to be Admitted Pro Hac Vice, # 5 Certification by Counsel to be Admitted Pro Hac Vice)(Kraft, Denise) (Entered: Jun. 10, 2008) (8 pgs).
Disclosure Statement pursuant to Rule 7.1 filed by SOITEC Silicon on Insulator Technologies SA, Commissariat a LEnergie Atomique. (Attachments: # 1 Certificate of Service)(Kraft, Denise) (Entered: Jun. 16, 2008) (3 pgs).
Motion to Dismiss Based upon or, in the Alternative, Motion for a More Definite Statement—filed by MEMC Electronic Materials Inc. (Rogowski, Patricia) (Entered: Jul. 9, 2008) (4 pgs).
Opening Brief in Support re 10 Motion to Dismiss Based upon or, in the Alternative, Motion for a More Definite Statement filed by MEMC Electronic Materials Inc..Answering Brief/Response due date per Local Rules is Jul. 28, 2008. (Rogowski, Patricia) (Entered: Jul. 9, 2008) (15 pgs).
Disclosure Statement pursuant to Rule 7.1 filed by MEMC Electronic Materials Inc. (Rogowski, Patricia) (Entered: Jul. 9, 2008) (3 pgs).
Answering Brief in Opposition re 10 Motion to Dismiss Based upon or, in the Alternative, Motion for a More Definite Statement filed by Commissariat a L'Energie Atomique. Reply Brief due date per Local Rules is Aug. 7, 2008. (Attachments: # 6 Exhibit A, # 7 Exhibit B, # Certificate of Service) (Kraft, Denise) (Modified on Jul. 29, 2008 (lid). (Entered: Jul. 28, 2008) (29 pgs).
Sealed Reply Brief re 10 Motion to Dismiss Based upon or, in the Alternative, Motion for a More Definite Statement filed by MEMC Electronic Materials Inc. (Rogowski, Patricia) (Entered: Aug. 7, 2008) Redacted Reply Brief re 14—re 10 Motion to Dismiss Based upon or, in the Alternative, Motion for a More Definite Statement filed by MEMC Electronic Materials Inc. (Attachments: # 1 Exhibit 2, # 2 Exhibit 3, # 3 Exhibit 4, # 4 Exhibit 5, # 5 Unreported Cases, # 6 Certificate of Service) (Rogowski, Patricia) Modified on Aug. 8, 2008 (lid). (Entered: Aug. 7, 2008) (98 pgs).
Redacted Reply Brief re 14—re 10 Motion to Dismiss Based upon or, in the Alternative, Motion for a More Definite Statement filed by Memo Electronic Materials Inc. (Attachments: # 1 Exhibit 2, # 2 Exhibit 3, # 3 Exhibit 4, # 4 Exhibit 5, # 5 Unreported Cases, # 6 Certificate of Service) (Rogowski, Patricia) Modified on Aug. 8, 2008 (lid). (Entered: Aug. 7, 2008) (98 pgs).
Memorandum Order denying 10 Motion to Dismiss Based upon or, in the Alternative, Motion for a More Definite Statement filed by MEMC Electronic Materials Inc., Order, Setting Hearings Telephonic Scheduling Conference set for Mar. 12, 2009 at 9:00 A.M. Signed by Judge Sue L. Robinson on Feb. 20, 2009. (nmf) (Entered: Feb. 20, 2009) (6 pgs).
Motion for Pro Hac Vice Appearance of Attorney B. Scott Eidson—filed by MEMC Electronic Materials Inc. (Attachments: # 1 Exhibit Certification by Counsel to be Admitted Pro Hac Vice)(Rogowski, Patricia) (Entered: Feb. 23, 2009) (4 pgs).
Notice of Service of Plaintiffs' Initial Disclosures Pursuant to Fed. R. Civ. P. 26(a)(1) by SOITEC Silicon on Insulator Technologies SA, Commissariat a L'Energie Atomique. (Attachments: # 1 Certificate of Service) (Kraft, Denise) (Entered: Feb. 27, 2009) (4 pgs).
Answer to 1 Complaint, with Jury Trial Demanded, Counterclaim against all plaintiffs by MEMC Electronic Materials Inc.. (Attachments: # 1 Exhibit a)(Rogowski, Patricia) (Entered: Mar. 6, 2009) (55 pgs).
Notice of Service of MEMC Electronic Materials, Inc.'s Initial Disclosures by MEMC Electronic Materials Inc. (Rogowski, Patricia) (Entered: Mar. 6, 2009) (3 pgs).
Proposed Order Proposed Scheduling Order re 16 Memorandum and Order, Set Hearings, by SOITEC Silicon on Insulator Technologies SA, Commissariat a 'LEnergie Atomique. (Kraft, Denise) (Entered: Mar. 10, 2009) (7 pgs).
Letter to the Honorable Sue L. Robinson from Denise Seastone Kraft, Esq. regarding [Proposed] Scheduling Order—re 21 Proposed Order, 16 Memorandum and Order, Set Hearings,. (Kraft, Denise) (Entered: Mar. 10, 2009) (1 pg).
Stipulation to Extend Time to Respond or Otherwise Plead to Defendant's Counterclaim to Apr. 7, 2009—filed by SOITEC Silicon on Insulator Technologies SA, Commissariat a L'Energie Atomique. (Attachments: # 1 Certificate of Service)(Kraft, Denise) (Entered: Mar. 11, 2009) (2 pgs).
Proposed Order Revised Scheduling Order re 21 Proposed Order, 16 Memorandum and Order Set Hearings, by SOITEC Silicon on Insulator Technologies SA, Commissariat a L'Energie Atomique. (Kraft, Denise) (Entered: Mar. 12, 2009) (7 pgs).
Letter to the Honorable Sue L. Robinson from Denise Seastone Kraft regarding Revised Scheduling Order Pursuant to Mar. 12, 2009 Telephonic Scheduling Conference—re 24 Proposed Order. (Kraft, Denise) (Entered: Mar. 12, 2009) (1 pg).
Scheduling Order: Case referred to the Magistrate Judge for the purpose of exploring ADR. Joiner of Parties due by Aug. 14, 2009. Amended Pleadings due by Aug. 14, 2009. Discovery due by Apr. 23, 2010. Discovery Conference set for Jun. 25, 2009 04:30 PM in Courtroom 6B before Judge Sue L. Robinson. Dispositive Motions due by Jun. 25, 2010. Answering Brief due Jul. 16, 2010. Reply Brief due Jul. 30, 2010. Oral Argument set for Aug. 27, 2010 09:30 AM in Courtroom 6B before Judge Sue L. Robinson. Claim Construction Opening Briefs due by Jun. 18, 2010. Response Briefs due Jul. 9, 2010. Final Pretrial Conference set for Oct. 14, 2010 04:30 PM in Courtroom 6B before Judge Sue L. Robinson. Jury Trial set for Oct. 25, 2010 09:30 AM in Courtroom 6B before Judge Sue L. Robinson. Signed by Judge Sue L. Robinson on Mar. 16, 2009. (nmf) (Entered: Mar. 16, 2009) (7 pgs).
Order Setting Teleconference: Telephone Conference set for Mar. 23, 2009 at 11:00 AM before Judge Mary Pat Thynge to discuss ADR. Signed by Judge Mary Pat Thynge on Mar. 16, 2009. (cak) (Entered: Mar. 16, 2009) (4 pgs).
Order Setting Teleconference: a teleconference has been scheduled for Monday, Jun. 1, 2009 at 10:00 a.m. with Magistrate Judge Thynge to discuss the status of the case and the parties negotiations. Counsel for MEMC shall initiate the teleconference call to 302-573-6173. It Is Further Ordered that the Court is holding Sep. 10, Sep. 14 and Sep. 15, 2009 as possible mediation dates. Counsel are to advise Judge Thynge by Mar. 30, 2009 if any of these dates works for everyone to schedule the mediation. Signed by Judge Mary Pat Thynge on Mar. 23, 2009. (cak) (Entered: Mar. 23, 2009) (2 pgs).
Order Setting Mediation Conferences: Mediation Conference Tentatively set for Sep. 15, 2009 at 10:00 AM in Courtroom 2B before Judge Mary Pat Thynge. See order for details. Signed by Judge Mary Pat Thynge on Mar. 24, 2009. (cak) (Entered: Mar. 24, 2009) (6 pgs).
Motion to Dismiss Based upon Fed. R. Civ. P. 12(b)(1) and (6) and Article III of the United States Constitution—filed by SOITEC Silicon on Insulator Technologies SA, Commissariat a LEnergie Atomique. (Attachments: # 1 Text of Proposed Order, # 2 Certificate of Service)(Kraft, Denise) (Entered: Apr. 7, 2009) (5 pgs).
Opening Brief in Support re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution filed by SOITEC Silicon on Insulator Technologies SA, Commissariat a L'Energie Atomique Answering Brief/Response due date per Local Rules is Apr. 27, 2009. (Attachments: # 1 Certificate of Service)(Kraft, Denise) (Entered: Apr. 7, 2009) (13 pgs).
Answer to 19 Answer to Complaint, Counterclaim Partial Answer to Defendant's Counterclaims, Affirmative Defenses and SOITEC Counterclaims, Counterclaim against MEMC Electronic Materials Inc. By SOITEC Silicon on Insulator Technologies SA, Commissariat a LEnergie Atomique. (Attachments: # 1 Certificate of Service)(Kraft, Denise) (Entered: Apr. 7, 2009) (18 pgs).
Notice of Service of First Request for Production of Documents and Things Directed to Commissariat a L'Energie Atomique; First Request for Production of Documents and Things Directed to Soitec Silicon on Insulator Technologies, S.A. And Soitec USA, Inc.; and First Set of Interrogatories Directed to SOITEC Silicon on Insulator Technologies, S.A., Soitec USA, Inc. and Commissariat a L'Energie Atomique by MEMC Electronic Materials Inc. (Rogowski, Patricia) (Entered: Apr. 14, 2009) (3 pgs).
Stipulation to Extend Time Defendant to File Answering Brief in Opposition to Plaintiffs' Partial Motion to Dismiss Counterclaim Counts II, III, IV, V, and VIII to May 6, 2009—filed by MEMC Electronic Materials Inc. (Rogowski, Patricia) (Entered: Apr. 21, 2009) (3 pgs).
Answer to 32 Answer to Counterclaim,,, of S.O.I. TEC Silicon on Insulator Technologies, S.A. and Soitec U.S.A., Inc. By MEMC Electronic Materials Inc. (Rogowski, Patricia) (Entered: Apr. 23, 2009) (4 pgs).
Stipulation to Extend Time Answering Brief in Opposition to Plaintiffs' Partial Motion to Dismiss Counterclaim Counts II, III, IV, V and VIII to May 15, 2009—filed by MEMC Electronic Materials Inc.. (Rogowski, Patricia) (Entered: May 6, 2009) (3 pgs).
Notice of Service of Soitec's First Set of Interrogatories (Nos. 1-17) and Soitec's First Set of Requests for Production of Documents and Things (Nos. 1-132) by SOITEC Silicon on Insulator Technologies SA, Commissariat a 'LEnergie Atomique. (Attachments: # 1 Certificate of Service)(Kraft, Denise) (Entered: May 6, 2009) (2 pgs).
Stipulation to Extend Time for Defendant to File an Answering Brief in Opposition to Plaintiffs' Partial Motion to Dismiss Counterclaim Counts II, III, IV, V, and VIII; and Stipulation to Extend Time for Plaintiffs to File Responses to MEMC's First Requests for Production of Documents and to MEMC's First Set of Interrogatories to May 29, 2009—filed by SOITEC Silicon on Insulator Technologies SA, Commissariat a L'Energie Atomique. (Attachments: # 1 Certificate of Service)(Kraft, Denise) (Entered: May 13, 2009).
Notice of Service of (1) Subpoena to Hayes Soloway, P.C., (2) Subpoena to Pearne & Gordon, LLP, (3) Subpoena to Brinks Hofer Gilson & Lione, and (4) Subpoena to Winston & Strawn by MEMC Electronic Materials Inc. (Rogowski, Patricia) (Entered: May 14, 2009) So Ordered—re 38 Stipulation to Extend Time. Set Briefing Schedule: re 30 Motion to Dismiss. (Answering Brief due May 29, 2009.) (Refer to Stipulation for Further Details.). Signed by Judge Sue L. Robinson on May 15, 2009. (lid) (Entered: May 15, 2009).
Stipulation to Extend Time for Defendant to File its Answering Brief until Jun. 5, 2009 by MEMC Electronic Materials Inc.. (Rogowski, Patricia) (Entered: May 28, 2009) So Ordered, re 40 Stipulation, Set Briefing Schedule: re 30 Motion to Dismiss Based upon Fed. R. Civ. P. 12(b)(1) and (6) and Article III of the United States Constitution. (Answering Brief due Jun. 5, 2009.). Signed by Judge Sue L. Robinson on May 29, 2009. (nmf) (Entered: May 29, 2009).
Notice of Service of (1) Soitec's Objections and Responses to MEMC's First Set of Interrogatories; (2) Soitecs Objections and Responses to MEMC's First Request for Production of Documents and Things; (3) CEAs Objections and Responses to MEMC's First Set of Interrogatories; and (4) CEAs Objections and Responses to MEMC's First Request for Production of Documents and Things by SOITEC Silicon on Insulator Technologies SA, Commissariat a L'Energie Atomique. (Attachments: # 1 Certificate of Service) (Kraft, Denise) (Entered: May 29, 2009).
Stipulation to extend date to Jun. 19, 2009 by which defendant may file an answering brief in opposition to plaintiffs' Partial Motion to Dismiss Counterclaim Counts II, III, IV, V, and VIII by MEMC Electronic Materials Inc.. (Rogowski, Patricia) (Entered: Jun. 5, 2009).
Notice of Service of MEMC's Answers to SOITEC's First Set of Interrogatories (Nos. 1-17) and MEMC's Responses to SOITEC's First Set of Requests for Production of Documents and Things (Nos. 1-132) by MEMC Electronic Materials Inc..(Rogowski, Patricia) (Entered: Jun. 5, 2009) So Ordered—re 42 Stipulation to Extend Time. Set Briefing Schedule: re 30 Motion to Dismiss. (Answering Brief due Jun. 19, 2009.). Signed by Judge Sue L. Robinson on Jun. 8, 2009. (lid) (Entered: Jun. 8, 2009).
Notice of Service of Soitec's Second Set of Requests for Production of Documents and Things (Nos. 133-135) re 41 Notice of Service by SOITEC Silicon on Insulator Technologies SA, Commissariat a LEnergie Atomique. Related document: 41 Notice of Service filed by SOITEC Silicon on Insulator Technologies SA, Commissariat a L'Energie Atomique. (Attachments: # 1 Certificate of Service)(Kraft, Denise) (Entered: Jun. 11, 2009).
Letter to Honorable Sue L. Robinson from Patricia Smink Rogowski regarding Transmitting Form of Protective Order. (Attachments: # 1 Form of Protective Order, # 2 Exhibit Exhibit a to Form of Protective Order)(Rogowski, Patricia) (Entered: Jun. 16, 2009).
Notice of Service of MEMC's Second Request for Production of Documents and Things Directed to S.O.I.TEC Silicon on Insulator Technologies, S.A. and Soitec USA, Inc. By MEMC Electronic Materials Inc. (Rogowski, Patricia) (Entered: Jun. 16, 2009) Set/Reset Hearings: Discovery Conference re-set per joint request of counsel for Sep. 16, 2009 08:30 AM in Courtroom 6B before Judge Sue L. Robinson. (nmf) (Entered: Jun. 18, 2009).
Stipulation to Extend Time Defendant's Answering Brief in Opposition to Plaintiffs' Partial Motion to Dismiss Counterclaim Counts II, III, IV, V, and VIII to Jul. 2, 2009—filed by MEMC Electronic Materials Inc.. (Rogowski, Patricia) (Entered: Jun. 19, 2009) So Ordered—re 47 Stipulation to Extend Time. Set Briefing Schedule: re 30 Motion to Dismiss (Answering Brief due Jul. 2, 2009.). Signed by Judge Sue L. Robinson on Jun. 23, 2009. (lid) (Entered: Jun. 23, 2009) So Ordered, re 45 Protective Order. Signed by Judge Sue L. Robinson on Jun. 30, 2009. (nmf) (Entered: Jun. 30, 2009).
Notice of by SOITEC Silicon on Insulator Technologies SA, Commissariat a L'Energie Atomique re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution *Notice of Withdrawal of Plaintiffs' Partial Motion to Dismiss Counterclaim Counts II, III, IV, V, and VIII* (Attachments: # 1 Certificate of Service)(Kraft, Denise) (Entered: Jul. 2, 2009).
Notice of Service of MEMC's Responses to SOITEC's Second Set of Requests for Production of Documents and Things Directed to MEMC by MEMC Electronic Materials Inc..(Rogowski, Patricia) (Entered: Jul. 14, 2009).
Stipulation and [Proposed] Order to File an Amended Complaint by SOITEC Silicon on Insulator Technologies SA, Commissariat a LEnergie Atomique. (Attachments: # 1 Exhibit A, # 2 Certificate of Service)(Kraft, Denise) (Entered: Jul. 16, 2009).
Notice of Service of Soitec's Objections and Responses to MEMC's Second Request for Production of Documents and Things Directed to Soitec re 46 Notice of Service by SOITEC Silicon on Insulator Technologies SA, Commissariat a LEnergie Atomique. Related document: 46 Notice of Service filed by MEMC Electronic Materials Inc. (Attachments: # 1 Certificate of Service)(Kraft, Denise) (Entered: Jul. 16, 2009).
Notice of Withdrawal of Docket Entry 51 by SOITEC Silicon on Insulator Technologies SA, Commissariat a L'Energie Atomique re 51 Notice of Service, (Attachments: # 1 Certificate of Service)(Kraft, Denise) (Entered: Jul. 17, 2009).

Notice of Service of SOITEC's Objections and Responses to MEMC's Second Request for Production of Documents and Things Directed to SOITEC re 46 Notice of Service by SOITEC Silicon on Insulator Technologies SA, Commissariat a L'Energie Atomique. Related document: 46 Notice of Service filed by MEMC Electronic Materials Inc.. (Attachments: # 1 Certificate of Service)(Kraft, Denise) (Entered: Jul. 17, 2009).

Notice of Service of MEMC Electronic Materials, Inc.'s Second Set of Interrogatories Directed to S.O.I.TEC Silicon on Insulator Technologies, S.A., SOITEC USA, Inc. And Commissariat a L'Energie Atomique by MEMC Electronic Materials Inc..(Rogowski, Patricia) (Entered: Jul. 17, 2009).

Notice of Service of Soitec's Production of Documents Bates Numbered SCEA 00000001 to SCEA 00002442 by SOITEC Silicon on Insulator Technologies SA, Commissariat a L'Energie Atomique. (Attachments: # 1 Certificate of Service)(Kraft, Denise) (Entered: Jul. 17, 2009) So Ordered, re 50 Stipulation. Signed by Judge Sue L. Robinson on Jul. 20, 2009. (nmf) (Entered: Jul. 20, 2009).

Notice of Service of MEMC's Production of Documents Bates Numbered MEMC0300000 to MEMC0306530 by MEMC Electronic Materials Inc. (Rogowski, Patricia) (Entered: Jul. 20, 2009).

First Amended Complaint for *Patent Infringement* against MEMC Electronic Materials Inc.—filed by SOITEC Silicon on Insulator Technologies SA, Commissariat a L'Energie Atomique. (Attachments: # 1 Exhibit Exhibit 1, # 2 Exhibit Exhibit 2, # 3 Exhibit Exhibit 3, # 4 Exhibit Exhibit 4, # 5 Certificate of Service)(Kraft, Denise) (Entered: Jul. 21, 2009).

Notice of Service of Soitec S.A.'s Second Set of Interrogatories (Nos. 18-22) and CEA's First Set of Interrogatories (Nos. 1-11) by SOITEC Silicon on Insulator Technologies SA, Commissariat a L'Energie Atomique. (Attachments: # 1 Certificate of Service)(Kraft, Denise) (Entered: Jul. 23, 2009).

Notice of Service of S.O.I.TEC Silicon on Insulator Technologies, S.A. and Commissariat a Lenergie Atomique Supplemental Production of Documents Bates Numbered SLIT 00000001 to SLIT 00049728 re 43 Notice of Service, by Soitec Silicon on Insulator Technologies SA, Commissariat a LEnergie Atomique. Related document: 43 Notice of Service, filed by MEMC Electronic Materials Inc.. (Attachments: # 1 Certificate of Service)(Kraft, Denise) (Entered: Jul. 27, 2009).

Answer to Amended Complaint Answer to 57 Amended Complaint, with Under Federal Rule of Civil Procedure 38, MEMC demands a trial by jury on all issues so triable., Counterclaim against all plaintiffs by MEMC Electronic Materials Inc.. (Attachments: # 1 Exhibit A, # 2 Certificate of Service)(Rogowski, Patricia) (Entered: Aug. 3, 2009).

Notice of Service of MEMC's Production of Documents Bates Numbered MEMC0300000—MEMC0337055 by MEMC Electronic Materials Inc. (Rogowski, Patricia) (Entered: Aug. 5, 2009).

Notice of Service of S.O.I.Tec Silicon on Insulator Technologies, S.A. and Commissariat a L Energie Atomique's Revised Supplemental Production of Documents Bates Numbered SLIT00000001—SLIT0004886; SLIT00004931 SLIT00004985; SLIT00005169 SLIT00005174; SLIT00005241 SLIT00006368; and SLIT00006886—SLIT00049728 re 59 Notice of Service, by SOITEC U.S.A., Inc., SOITEC Silicon on Insulator Technologies SA, Commissariat a LEnergie Atomique. Related document: 59 Notice of Service, filed by Soitec Silicon on Insulator Technologies SA, Commissariat a LEnergie Atomique. (Attachments: # 1 Certificate of Service)(Kraft, Denise) (Entered: Aug. 6, 2009).

Stipulation to Extend Time to Answer or Otherwise Respond to MEMC's Amended Counterclaims to Aug. 31, 2009—filed by SOITEC Silicon on Insulator Technologies SA, SOITEC U.S.A., Inc., Commissariat a L'Energie Atomique. (Attachments: # 1 Certificate of Service)(Kraft, Denise) (Entered: Aug. 25, 2009).

Notice of Service of S.O.I.TEC Silicon on Insulator Technologies, S.A. and Commissariat a L'Energie Atomique's Supplemental Production of Documents Bates Numbered SOIT 00000001 to SOIT 00003528 and SLIT 00049729 to Slit 00060612 by SOITEC Silicon on Insulator Technologies SA, SOITEC U.S.A., Inc., Commissariat a L'Energie Atomique. (Attachments: # 1 Certificate of Service)(Kraft, Denise) (Entered: Aug. 25, 2009).

Notice of Service of MEMC's Production of Documents Bates Numbered MEMC0337056 to MEMC0337503 and MEMC0337504-MEMC0338047 by MEMC Electronic Materials Inc..(Rogowski, Patricia) (Entered: Aug. 26, 2009).

Notice of Service of (1) SOITECs Supplemental Responses to MEMC Electronic Materials, Inc's First Set of Interrogatories; and (2) CEAs Supplemental Responses to MEMC Electronic Materials, Inc.s First Set of Interrogatories re 41 Notice of Service,, by SOITEC Silicon on Insulator Technologies SA, SOITEC U.S.A., Inc., Commissariat a L'Energie Atomique. Related document: 41 Notice of Service filed by SOITEC Silicon on Insulator Technologies SA, Commissariat a L'Energie Atomique. (Attachments: # 1 Certificate of Service)(Kraft, Denise) (Entered: Aug. 26, 2009).

Notice of Service of MEMC's Supplemental Answers to SOITEC's First Set of Interrogatories by MEMC Electronic Materials Inc.. (Rogowski, Patricia) (Entered: Aug. 27, 2009) So Ordered—re 63 Stipulation to Extend Time. Set/Reset Answer Deadlines: SOITEC Silicon on Insulator Technologies SA answer due Aug. 31, 2009; Commissariat a L'Energie Atomique answer due Aug. 31, 2009; SOITEC U.S.A., Inc. answer due Aug. 31, 2009. Signed by Judge Sue L. Robinson on Aug. 27, 2009. (lid) (Entered: Aug. 27, 2009).

Answer to 60 Answer to Amended Complaint, Counterclaim,,, Counterclaim *Reply to Defendant's Amended Counterclaims, Counterclaims and Affirmative Defenses* against MEMC Electronic Materials Inc. By SOITEC Silicon on Insulator Technologies SA, Commissariat a L'Energie Atomique, SOITEC U.S.A., Inc.. (Attachments: # 1 Certificate of Service)(Kraft, Denise) (Entered: Aug. 31, 2009).

Notice of Service of MEMC's Third Set of Interrogatories Directed to S.O.I.TEC Silicon on Insulator Technologies, S.A., SOITEC USA, Inc., and Commissariat a L'Energie Atomique by MEMC Electronic Materials Inc. (Rogowski, Patricia) (Entered: Sep. 1, 2009).

Answer to 68 Answer to Counterclaim,,, by MEMC Electronic Materials Inc..(Rogowski, Patricia) (Entered: Sep. 14, 2009). Minute Entry for proceedings held before Judge Sue L. Robinson—Discovery Conference held on Sep. 16, 2009. (Court Reporter V. Gunning.) (nmf) (Entered: Sep. 16, 2009).

Notice of Service of Soitec S.A.'s Third Set of Interrogatories (Nos. 23-27) re 58 Notice of Service, by SOITEC Silicon on Insulator Technologies SA, SOITEC U.S.A., Inc., Commissariat a LEnergie Atomique. Related document: 58 Notice of Service, filed by SOITEC Silicon on Insulator Technologies SA, Commissariat a LEnergie Atomique. (Attachments: # 1 Certificate of Service)(Kraft, Denise) (Entered: Sep. 22, 2009).

Notice of Service of MEMC Electronic Materials Inc.'s Answers to SOITEC S.A.'S Second Set of Interrogatories (Nos. 8-22) and MEMC Electronic Materials, Inc.'S Answers to CEA'S First Set of Interrogatories (Nos. 1-11) by MEMC Electronic Materials Inc.. (Rogowski, Patricia) (Entered: Oct. 16, 2009).

Notice of Service of S.O.I.TEC Silicon on Insulator Technologies, S.A. and Commissariat a L'Energie Atomique's Supplemental Production of Documents Bates Numbered SOIT 00003529 to SOIT 00004244 by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 16, 2009).

Notice of Service of S.O.I.TEC Silicon on Insulator Technologies, S.A. and Commissariat a L'Energie Atomique's Supplemental Production of Documents Bates Numbered SOIT 00003258.001-.057; SOIT 00003342.001-.007; SOIT 00003343.001-.009; (Con't)—SOIT 00003409.001-.015; and SOIT 00003469.001-.015 by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 16, 2009).

Notice of Service of SOITEC/CEA Parties' Objections and Responses to MEMC Electronic Materials, Inc.'s Second Set of Interrogatories by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 16, 2009).

Notice of Service of S.O.I.TEC Silicon on Insulator Technologies, S.A. and Commissariat LEnergie Atomique Supplemental Production of Documents Bates Numbered SOIT 00004245 to SOIT 00205027 by SOITEC Silicon on Insulator Technologies SA, SOITEC U.S.A., Inc., Commissariat a LEnergie Atomique. (Attachments: # 1 Certificate of Service)(Kraft, Denise) (Additional attachment(s) added on Oct. 23, 2009: # 2 revised) (lid). Modified on Oct. 23, 2009 (lid). (Entered: Oct. 16, 2009).

Motion to Bifurcate *the Issues of Willfulness and Damages for Purposes of Discovery and Trial and proposed Form of Order*—filed by MEMC Electronic Materials Inc.. (Rogowski, Patricia) (Entered: Oct. 20, 2009). Correcting Entry: Docket clerk deleted D.I. 78 (opening brief) due to document being filed improperly. Counsel is advised to re-file document using the Opening Brief event code rather than the combined opening and answering brief event code. (lid) (Entered: Oct. 21, 2009).

Opening Brief in Support re 77 Motion to Bifurcate *the Issues of Willfulness and Damages for Purposes of Discovery and Trial and proposed Form of Order* filed by MEMC Electronic Materials Inc.. Answering Brief/Response due date per Local Rules is Nov. 9, 2009. (Attachments: # 1 Exhibit A, # 2 Exhibit B, # 3 Exhibit C)(Rogowski, Patricia) (Entered: Oct. 21, 2009).

Notice of Service of MEMC's Production of Documents Bates Numbered MEMC0338048-MEMC0345027 by MEMC Electronic Materials Inc..(Rogowski, Patricia) (Entered: Oct. 23, 2009).

Notice of Service of S.O.I.TEC Silicon on Insulator Technologies, S.A. and Commissariat a L'Energie Atomique Supplemental Production of Replacement Documents Bates Numbered SCEA 00001337 to SCEA 00001339; SCEA 00002434 to SCEA 00002439; SOIT 00007961; SOIT 00006718 to SOIT 00006727; and SOIT 00007595 to SOIT 00007598 by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 23, 2009) Correcting Entry: Pursuant to request of counsel, correct pdf of D.I. 76 has been attached and text of entry has been modified to correct bates No. (lid) (Entered: Oct. 23, 2009).

Notice of Service of of S.O.I.TEC Silicon on Insulator Technologies, S.A. and Commissariat a L'Energie Atomique's Supplemental Production of Documents Bates Numbered SOIT 00205028 to SOIT 00206175; SCEA 00002443 to SCEA 00003974; and SLIT 00060613 to SLIT 00063784 by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 28, 2009).

Notice of Service of MEMC'S Answers TOSOITEC S.A.'S Third Set of Interrogatories (Nos. 23-27) by MEMC Electronic Materials Inc..(Rogowski, Patricia) (Entered: Oct. 28, 2009).

Notice of Service of S.O.I.TEC Silicon on Insulator Technologies, S.A. and Commissariat a L'Energie Atomique's Supplemental Production of Documents Bates Numbered SOIT 00206176 to SOIT 00206183 by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 28, 2009).

Notice of Service of SOITEC/CEA Parties' Objections and Responses to MEMC Electronic Materials, Inc.'s Third Set of Interrogatories by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 29, 2009).

Cross Motion to Bifurcate all Collateral Issues—filed by SOITEC Silicon on Insulator Technologies SA, SOITEC U.S.A., Inc., Commissariat a LEnergie Atomique. (Attachments: # 1 Text of Proposed Order, # 2 Certificate of Service)(Kraft, Denise) (Entered: Nov. 9, 2009).

Answering Brief in Opposition re 85 Cross Motion to Bifurcate *all Collateral Issues*, 77 Motion to Bifurcate *the Issues of Willfulness and Damages for Purposes of Discovery and Trial and proposed Form of Order* filed by SOITEC Silicon on Insulator Technologies SA, Commissariat a LEnergie Atomique.Reply Brief due date per Local Rules is Nov. 20, 2009. (Attachments: # 1 Exhibit, # 2 Exhibit, # 3 Exhibit, # 4 Exhibit, # 5 Exhibit, # 6 Exhibit, # 7 Exhibit, # 8 Exhibit, # 9 Exhibit, # 10 Exhibit, # 11 Exhibit, # 12 Declaration, # 13 Certificate of Service)(Kraft, Denise) (Entered: Nov. 9, 2009).

Notice of Service of CEA's Second Set of Interrogatories (Nos. 12-16) by SOITEC Silicon on Insulator Technologies SA, SOITEC U.S.A., Inc., Commissariat a LEnergie Atomique. (Attachments: # 1 Certificate of Service)(Kraft, Denise) (Entered: Nov. 11, 2009) Correcting Entry: Pursuant to request of counsel, Exhibit a to D.I. 86 has been deleted and will be re-filed under seal by counsel at a later time (lid) (Entered: Nov. 12, 2009).

Sealed Exhibit re 86 Answering Brief in Opposition by SOITEC Silicon on Insulator Technologies SA, SOITEC U.S.A., Inc., Commissariat a LEnergie Atomique. (Attachments: # 1 Certificate of Service)(Kraft, Denise) (Entered: Nov. 12, 2009).

Reply Brief re 77 Motion to Bifurcate *the Issues of Willfulness and Damages for Purposes of Discovery and Trial and proposed Form of Order* filed by MEMC Electronic Materials Inc.. (Attachments: # 1 Exhibit 1, # 2 Exhibit 2, # 3 Exhibit 3)(Rogowski, Patricia) (Entered: Nov. 17, 2009).

Answering Brief in Opposition re 85 Cross Motion to Bifurcate *all Collateral Issues* filed by MEMC Electronic Materials Inc.. Reply Brief due date per Local Rules is Dec. 3, 2009. (Rogowski, Patricia) (Entered: Nov. 19, 2009).

Notice of Service of S.O.I.TEC Silicon on Insulator Technologies, S.A. and Commissariat a L'Energie Atomique's Supplemental Production of Documents Bates Numbered SOIT 00206184 to SOIT 00206997 by Commissariat a LEnergie Atomique, SOITEC Silicon on Insulator Technologies SA, SOITEC U.S.A., Inc.. (Attachments: # 1 Certificate of Service)(Kraft, Denise) (Entered: Nov. 23, 2009).

Notice of Service of (1) Subpoena in a Civil Case to J. William Dockrey; (2) Subpoena in a Civil Case to Allan Fanucci, Esq.; (3) Amended Notice of Videotaped Deposition of Saeed Pirooz; (4) Notice of Videotaped Deposition of Commissariat a L'Energie Atomique; and (5) Notice of Videotaped Deposition of S.O.I.TEC Silicon on Insulator Technologies, S.A. and SOITEC U.S.A., Inc. By Memc Electronic Materials Inc..(Rogowski, Patricia) (Entered: Nov. 30, 2009).

Notice of Service of S.O.I.TEC Silicon on Insulator Technologies, S.A. and Commissariat a L'Energie Atomique's Supplemental Production of Documents Bates Numbered BHR000000001 to BHR000036157 by Commissariat a LEnergie Atomique, SOITEC Silicon on Insulator Technologies SA, SOITEC U.S.A., Inc.. (Attachments: # 1 Certificate of Service)(Kraft, Denise) (Entered: Dec. 2, 2009).

Reply Brief re 85 Cross Motion to Bifurcate all Collateral Issues filed by Commissariat a LEnergie Atomique, SOITEC Silicon on Insulator Technologies SA, SOITEC U.S.A., Inc.. (Attachments: # 1 Exhibit Declaration of Marcus T. Hall in Support of Plaintiffs' Reply Re: Cross-Motion to Bifurcate all Collateral Issues)(Kraft, Denise) (Entered: Dec. 3, 2009).

Notice of Service of S.O.I.TEC Silicon on Insulator Technologies, S.A. and Commissariat a L'Energie Atomique's Production of Three Boxes of Wafer Samples by Commissariat a LEnergie Atomique, SOITEC Silicon on Insulator Technologies SA, SOITEC U.S.A., Inc.. (Attachments: # 1 Certificate of Service)(Kraft, Denise) (Entered: Dec. 8, 2009). Set Hearings: Discovery Conference set for Dec. 21, 2009 04:00 PM in Courtroom 6B before Judge Sue L. Robinson. (nmf) (Entered: Dec. 9, 2009).

Notice of Service of (1) Six Cartons of 300 MM Wafer Samples and 1 Carton of 200 MM Wafer Samples; (2) Documents Marked MEMC0345028-MEMC0345084; (3) Documents Marked MEMC0345085-MEMC0345133; (4) MEMC'S Answers to CEA'S Second Set of Interrogatories (Nos. 12-16); and (5) MEMC'S First Set of Requests for Admission to S.O.I.TEC Silicon on Insulator Technologies, S.A. and SOITEC USA, Inc. By MEMC Electronic Materials Inc..(Rogowski, Patricia) (Entered: Dec. 14, 2009).

Motion for Leave to File *Stipulated Motion for Leave to File a Sur-Reply Brief in Support of MEMC's Motion to Bifurcate*—filed by MEMC Electronic Materials Inc.. (Attachments: # 1 Exhibit 1)(Rogowski, Patricia) (Entered: Dec. 14, 2009).

Redacted Version of 88 Exhibit to a Document *Cross Motion to Bifurcate all Collateral Issues* by Commissariat a LEnergie Atomique, SOITEC Silicon on Insulator Technologies SA, SOITEC U.S.A., Inc.. (Kraft, Denise) (Entered: Dec. 14, 2009). So Ordered— re 97 Motion for Leave to File. Signed by Judge Sue L. Robinson on Dec. 16, 2009. (lid) (Entered: Dec. 16, 2009).

Sur-Reply Brief re 77 Motion to Bifurcate *the Issues of Willfulness and Damages for Purposes of Discovery and Trial and proposed Form of Order MEMC's Sur-Reply Brief in Support of Its Motion to*

*Bifurcate the Issues of Willfulness and Damages for Purposes of Discovery and Trial* filed by MEMC Electronic Materials Inc.. (Rogowski, Patricia) (Entered: Dec. 16, 2009).
Notice of Service of S.O.I.TEC Silicon on Insulator Technologies, S.A. and Commissariat a L'Energie Atomique's Supplemental Production of Documents Bates Numbered SOIT 00207008 to SOIT 00207591 by SOITEC Silicon on Insulator Technologies SA, SOITEC U.S.A., Inc.. (Attachments: # 1 Certificate of Service)(Kraft, Denise) (Entered: Dec. 17, 2009). Minute Entry for proceedings held before Judge Sue L. Robinson—Conference held on Dec. 21, 2009. (Court Reporter V. Gunning.) (nmf) (Entered: Dec. 22, 2009). Oral Order by Judge Sue L. Robinson in open court on Dec. 21, 2009 granting 77 Motion to Bifurcate *he Issues of Willfulness and Damages for Purposes of Discovery and Trial and proposed Form of Order*, denying 85 Cross Motion to Bifurcate all Collateral Issues. (nmf) (Entered: Dec. 22, 2009).
Notice of Service of S.O.I.TEC Silicon on Insulator Technologies, S.A. and Commissariat L'Energie Atomique's Production 12 of CD-ROM Documents Bates Numbered SOIT 00207008 to SOIT 00207591 by Commissariat a LEnergie Atomique, SOITEC Silicon on Insulator Technologies SA, SOITEC U.S.A., Inc..(Kraft, Denise) (Entered: Dec. 22, 2009).
Notice of Service of S.O.I.TEC Silicon on Insulator Technologies, S.A. and Commissariat L'Energie Atomique's Supplemental Production of Documents Bates Numbered BHR000036158 to BHR000036584, served on Dec. 11, 2009; and S.O.I.TEC Silicon on Insulator Technologies, S.A. and Commissariat L'Energie Atomique's Supplemental Production of Documents Bates Numbered BHR000036585 to BHR000036731, served on Dec. 18, 2009 by SOITEC Silicon on Insulator Technologies SA, SOITEC U.S.A., Inc.. (Attachments: # 1 Certificate of Service)(Kraft, Denise) (Entered: Dec. 22, 2009). Correcting Entry: Pursuant to conversation docket clerk deleted Notice of filing due to document being filed improperly. Counsel will re-file document at a later time. (lid) (Entered: Jan. 4, 2010).
Notice of Service of S.O.I.TEC Silicon on Insulator Technologies, S.A. and SOITEC USA, Inc.'s Objections and Responses to MEMC's Nov. 25, 2009 Notice of 30(b)(6) Deposition of Soitec, and Commissariat a l'Energie Atomique's Objections and Responses to MEMC's Nov. 25, 2009 Notice of 30(b)(6) Deposition of CEA by Commissariat a LEnergie Atomique, SOITEC Silicon on Insulator Technologies SA, SOITEC U.S.A., Inc.. (Attachments: # 1 Certificate of Service)(Kraft, Denise) (Entered: Jan. 4, 2010).
Stipulation to Amend Scheduling Order re 26 Scheduling Order,,, by MEMC Electronic Materials Inc.. (Rogowski, Patricia) (Entered: Jan. 6, 2010).
Notice of Service of S.O.I.TEC Silicon on Insulator Technologies, S.A. and Commissariat L'Energie Atomique's Production of Documents Bates Numbered HS0000001 to HS0000792 by Commissariat a LEnergie Atomique, SOITEC Silicon on Insulator Technologies SA, SOITEC U.S.A., Inc.. (Attachments: # 1 Certificate of Service)(Kraft, Denise) (Entered: Jan. 6, 2010).
Notice of Service of Documents Marked (1) MEMC0345134-MEMC0391283 and (2) MEMC0391284-MEMC0413109 by MEMC Electronic Materials Inc..(Rogowski, Patricia) (Entered: Jan. 7, 2010). So Ordered—re 104 Stipulation Amending Scheduling Order. Order—Setting Scheduling Order Deadlines (Claims Construction Opening Brief due by Jun. 18, 2010., Discover due by Jun. 18, 2010.) (Refer to Stipulation for Further Details). Signed by Judge Sue L. Robinson on Jan. 7, 2010. (lid) (Entered: Jan. 7, 2010).
Notice of Service of S.O.I.TEC Silicon on Insulator Technologies, S.A. and Soitec USA, Inc.'s Responses to MEMC Electronic Materials, Inc.'s First Set of Requests for Admission by Commissariat a LEnergie Atomique, SOITEC Silicon on Insulator Technologies SA, SOITEC U.S.A., Inc.. (Attachments: # 1 Certificate of Service)(Kraft, Denise) (Entered: Jan. 11, 2010).
Notice of Service of Documents Marked MEMC0413110-MEMC0459972 by MEMC Electronic Materials Inc..(Rogowski, Patricia) (Entered: Jan. 13, 2010).
Notice of Service of Notice of Videotaped Depositions of Emmanuel Huyghe, Clotilde Turleque, Christophe Maleville and Hubert Moriceau by MEMC Electronic Materials Inc..(Rogowski, Patricia) (Entered: Jan. 14, 2010).

Notice of Service of Notice of Videotaped Deposition of Norman Soloway by MEMC Electronic Materials Inc..(Rogowski, Patricia) (Entered: Jan. 14, 2010).
Notice of Service of Notice of Videotaped Depositions of (1) Emmanuel Arene, (2) Bruno Ghyselen, (3) Thierry Barge, (4) Chrystelle Legahe, (5) Konstantine Bourdelle, (6) Andre-Jacques Auberton-Herve, (7) Bernard Aspar, (8) Thierry Poumeyrol, and (9) Michel Bruel by MEMC Electronic Materials Inc..(Rogowski, Patricia) (Entered: Jan. 20, 2010).
Notice of Service of S.O.I.TEC Silicon on Insulator Technologies, S.A. and Commissariat L'Energie Atomique's Production 16 of CD-ROM Documents Bates No. SOIT 00207592 to SOIT 00218102 by Commissariat a LEnergie Atomique, SOITEC Silicon on Insulator Technologies SA, SOITEC U.S.A., Inc.. (Attachments: # 1 Certificate of Service)(Kraft, Denise) (Entered: Jan. 20, 2010).
Motion for Pro Hac Vice Appearance of Attorney Laura K. Carter—filed by Commissariat a LEnergie Atomique, SOITEC Silicon on Insulator Technologies SA, SOITEC U.S.A., Inc.. (Attachments: # 1 Text of Proposed Order, # 2 Certification, # 3 Certificate of Service)(Kraft, Denise) (Entered: Jan. 21, 2010). So Ordered—re 113 Motion for Pro Hac Vice Appearance of Attorney Laura K. Carter. Signed by Judge Sue L. Robinson on Jan. 26, 2010. (lid) (Entered: Jan. 26, 2010).
Notice of Service of S.O.I.TEC Silicon on Insulator Technologies, S.A. and Commissariat L'Energie Atomique's Production 17 of CD-ROM Documents Bates No. SOIT 00218103 to SOIT 00219113 by Commissariat a LEnergie Atomique, SOITEC Silicon on Insulator Technologies SA, SOITEC U.S.A., Inc.. (Attachments: # 1 Certificate of Service)(Kraft, Denise) (Entered: Jan. 27, 2010).
Notice of Service of S.O.I.TEC Silicon on Insulator Technologies, S.A. and Commissariat L'Energie Atomique's Production of Documents Bates No. SOIT 00219114 to SOIT 00219229 by Commissariat a LEnergie Atomique, SOITEC Silicon on Insulator Technologies SA, SOITEC U.S.A., Inc.. (Attachments: # 1 Certificate of Service)(Kraft, Denise) (Entered: Jan. 27, 2010).
Notice of Service of Documents Marked (1) MEMC0459973-MEMC-0526213; (2) MEMC0526214-MEMC-0526273; and (3) MEMC0484547-MEMC0526213 by MEMC Electronic Materials Inc..(Rogowski, Patricia) (Entered: Jan. 29, 2010).
Notice of Service of Six DVDs Containing Documents Marked MEMC0526274-MEMC0582949 by MEMC Electronic Materials Inc..(Rogowski, Patricia) (Entered: Feb. 2, 2010).
Notice of Service of Documents Marked MEMC0582950-MEMC0618792 by MEMC Electronic Materials Inc..(Rogowski, Patricia) (Entered: Feb. 8, 2010).
Notice of Service of Documents Marked (1) MEMC0618793-MEMC0697890 and (2) MEMC0697891-MEMC0715676 by MEMC Electronic Materials Inc..(Rogowski, Patricia) (Entered: Feb. 12, 2010).
Notice of Service of Documents Marked MEMC0715677-MEMC0772697 by MEMC Electronic Materials Inc..(Rogowski, Patricia) (Entered: Feb. 18, 2010).
Notice of Service of Notice of Videotaped Deposition by MEMC Electronic Materials Inc..(Rogowski, Patricia) (Entered: Feb. 19, 2010).
Notice of Service of S.O.I.TEC Silicon on Insulator Technologies, S.A. and Commissariat Lnergie Atomiques Production 19 of CD-ROM Documents Bates No. SOIT 00219230—SOIT 00242462, SOIT 00242514—SOIT 00271070, SOIT 00271093—SOIT 00277765, SOIT 00277802-SOIT 00280854 by Commissariat a LEnergie Atomique, SOITEC Silicon on Insulator Technologies SA, SOITEC U.S.A., Inc.. (Attachments: # 1 Certificate of Service)(Kraft, Denise) (Entered: Mar. 2, 2010).
Notice of Service of S.O.I.TEC Silicon on Insulator Technologies, S.A. and Commissariat Lnergie Atomiques Production 20 of CD-ROM Documents Bates No. SOIT 00280855—SOIT 00310785 by Commissariat a LEnergie Atomique, SOITEC Silicon on Insulator Technologies SA, SOITEC U.S.A., Inc.. (Attachments: # 1 Certificate of Service)(Kraft, Denise) (Entered: Mar. 2, 2010).
Notice of Service of S.O.I.TEC Silicon on Insulator Technologies, S.A. and Commissariat Lnergie Atomiques Production 21 of CD-ROM Documents Bates No. SCEA 00003975—SCEA 00004146 and SOIT 00310786—SOIT 00336534 by Commissariat a LEnergie Atomique, SOITEC Silicon on Insulator Technologies SA, SOITEC U.S.A., Inc.. (Attachments: # 1 Certificate of Service)(Kraft, Denise) (Entered: Mar. 2, 2010).
Notice of Service of S.O.I.TEC Silicon on Insulator Technologies, S.A. and Commissariat Lnergie Atomiques Production 22 of CD-ROM Documents Bates No. SCEA 00004147—SCEA 00031465 and SOIT 00336535—SOIT 00355547 and SOIT 00355554—SOIT 00359693 by Commissariat a LEnergie Atomique, SOITEC Silicon on Insulator Technologies SA, SOITEC U.S.A., Inc.. (Attachments: # 1 Certificate of Service)(Kraft, Denise) (Entered: Mar. 2, 2010).
Notice of Service of S.O.I.TEC Silicon on Insulator Technologies, S.A.'s Fourth Set of Interrogatories (Nos. 28-29) Directed to MEMC Electronic Materials, Inc. By Commissariat a LEnergie Atomique, SOITEC Silicon on Insulator Technologies SA, SOITEC U.S.A., Inc.. (Attachments: # 1 Certificate of Service)(Kraft, Denise) (Additional attachment(s) added on Mar. 24, 2010: # 1 Certificate of Service) (fms). (Entered: Mar. 3, 2010).
Stipulation to Amend Scheduling Order re 26 Scheduling Order,,, by MEMC Electronic Materials Inc.. (Rogowski, Patricia) (Entered: Mar. 12, 2010). So Ordered—re 127 Stipulation to Amend Scheduling Order. Order—Setting Scheduling Order Opening Brief due by Jun. 18, 2010., Discovery due by Jun. 18, 2010.) (Refer to Stipulation for Details). Signed by Judge Sue L. (lid) (Entered: Mar. 15, 2010).
Notice of Service of (1) MEMC Electronic Materials, Inc.'s Second Set of Requests for Admission Directed to Plaintiffs and (2) MEMC Electronic Materials, Inc.'s Fourth Set of Interrogatories Directed to S.O.I.TEC Silicon on Insulator Technologies, S.A., SOITEC USA, Inc. and Commissariat a L'Energie Atomique by MEMC Electronic Materials Inc..(Rogowski, Patricia) (Entered: Mar. 23, 2010). Correcting Entry: Per request of counsel, the pdf attached to D.I. 126 (Notice of Service of S.O.I.TEC Silicon on Insulator Technologies, S.A.'s Fourth Set of Interrogatories (Nos. 28-29) Directed to MEMC Electronic Materials, Inc. By Commissariat a LEnergie Atomique, SOITEC Silicon on Insulator Technologies SA, SOITEC U.S.A., Inc.) has been deleted and replaced with the proper attachment with the correct date. (fms) (Entered: Mar. 24, 2010). Correcting Entry: Per request of counsel, D.I. 129 has been deleted and will be re-filed at a later time. (lid) (Entered: Mar. 29, 2010).
Notice of Service of S.O.I.TEC Silicon on Insulator Technologies, S.A.'s Production 23 Bates No. SOIT 00359694 and SOIT 00359695, including Wafer Samples by SOITEC Silicon on Insulator Technologies SA. (Attachments: # 1 Certificate of Service)(Kraft, Denise) (Entered: Mar. 29, 2010).
Notice of Service of S.O.I.TEC Silicon on Insulator Technologies, S.A.'s Production 24 of CD-ROM Documents Bates No. SOIT 00359696—SOIT 00419315 by SOITEC Silicon on Insulator Technologies SA. (Attachments: # 1 Certificate of Service)(Kraft, Denise) (Entered: Apr. 1, 2010).
Notice of Service of Electronic Production of OCR Text Files related to: (1) S.O.I.TEC Silicon on Insulator Technologies, S.A.'s Production 19 Bates No. SOIT 00219230-SOIT 00242462; SOIT 00242514-SOIT 00271070; SOIT 00271093-SOIT 00277765; SOIT 00277802-SOIT 00280854; (2) S.O.I.TEC Silicon on Insulator Technologies, S.A.'s Production 20 Bates No. SOIT 00280855—SOIT 00310785; and (3) S.O.I.TEC Silicon on Insulator Technologies, S.A. and Commissariat a L'Energie Atomique's Production 22 Bates No. SCEA 00004147-SCEA 00031465; SOIT 00336535-SOIT 00355547; and SOIT 00355554-SOIT 00359693 by Commissariat a LEnergie Atomique, SOITEC Silicon on Insulator Technologies SA. (Attachments: # 1 Certificate of Service)(Kraft, Denise) (Entered: Apr. 7, 2010).
Notice of Service of (1) Documents marked MEMC0772698-MEMC0775891; (2) Documents marked CRAV00000001-CRAV00000098; and (3) Document marked MEMC0775892 by MEMC Electronic Materials Inc..(Rogowski, Patricia) (Entered: Apr. 7, 2010).
Notice of Service of MEMC Electronic Materials, Inc.'s Supplemental Answer to CEA's First Set of Interrogatories, MEMC's Answers to SOITEC S.A.'s Fourth Set of Interrogatories (Nos. 28-29), and MEMC'S Supplemental Answers to SOITEC S.A.'S Third Set of Interrogatories (No. 23) by MEMC Electronic Materials Inc.. (Rogowski, Patricia) (Entered: Apr. 7, 2010). Set Hearings: Discovery Conference set for Apr. 23, 2010 09:30 AM in Courtroom 6B before Judge Sue L. Robinson. (nmf) (Entered: Apr. 21, 2010).
Notice of Service of S.O.I.TEC Silicon on Insulator Technologies, S.A.'s Production of Documents Bates No. SOIT 00419316 (updated from previously produced documents Bates No. SOIT 00000159-SOIT 00000161) by SOITEC Silicon on Insulator Technologies SA. (Attachments: # 1 Certificate of Service)(Kraft, Denise) (Entered: Apr. 22, 2010). Minute Entry for proceedings held before Judge Sue L. Robinson—Discovery Conference held on Apr. 23, 2010. (Court Reporter V. Gunning.) (nmf) (Entered: Apr. 23, 2010).
Notice of Service of S.O.I.TEC Silicon on Insulator Technologies, S.A. and Commissariat a L'Energie Atomique's electronic production of: (1) Production #25 Bates No. SCEA00031466-SCEA00032999; SOIT00419316-SOIT00422470; and SOIT00422478-SOIT00461551; (2) Production #26 Bates Numbered SCEA00033000-SCEA00165680; SCEA00165686-SCEA00167229; SCEA00167232-SCEA00167288; and SOIT00461552-SOIT00474611; and (3) Production #27 Bates Numbered SCEA00167289-SCEA00167291; and SOIT00474611-SOIT00476375 by Commissariat a LEnergie Atomique, SOITEC Silicon on Insulator Technologies SA. (Attachments: # 1 Certificate of Service)(Kraft, Denise) (Entered: Apr. 29, 2010).
Notice of Service of Commissariat a L'Energie Atomique's Production #28 of CD-ROM Documents Bates No. SCEA00167292-SCEA00167308 by Commissariat a LEnergie Atomique. (Attachments: # 1 Certificate of Service)(Kraft, Denise) (Entered: Apr. 29, 2010).
Notice of Service of (1) Notice of Videotaped Deposition (Michael Bruel) and (2) Notice of Videotaped Deposition (S.O.I.TEC Silicon on Insulator Technologies, S.A. and SOITEC USA, Inc.) by MEMC Electronic Materials Inc..(Rogowski, Patricia) (Entered: May 3, 2010).
Notice of Service of (1) DVD Containing Video Marked CRA V00000099; (2) CD Containing Documents Marked MEMC0775893-MEMC0775948; (3) CD Containing Documents Marked MEMC0775949-MEMC0775954; and (4) DVD Containing Documents Marked MEMC0775955-MEMC0781961 by MEMC Electronic Materials Inc.. (Rogowski, Patricia) (Entered: May 3, 2010).
Notice of Service of Commissariat a L'Energie Atomique's Production #29 of CD-ROM Documents Bates No. SCEA 00167309-SCEA 00167315 by Commissariat a LEnergie Atomique. (Attachments: # 1 Certificate of Service)(Kraft, Denise) (Entered: May 3, 2010).
Notice of Service of (1) S.O.I.TEC Silicon on Insulator Technologies, S.A., SOITEC USA, Inc., and Commissariat a L'Energie Atomique's Responses to MEMC's Fourth Set of Interrogatories; and (2) S.O.I.TEC Silicon on Insulator Technologies, S.A., and Commissariat a L'Energie Atomique's Responses to MEMC's Second Set of Request for Admissions re 128 Notice of Service, by Commissariat a LEnergie Atomique, SOITEC Silicon on Technologies SA, SOITEC U.S.A., Inc. Related document: 128 Notice of Service, filed by MEMC Electronic Materials Inc. (Attachments: #1 Certificate of Service)(Kraft, Denise) (Entered: May 4, 2010). Reset Hearings: Oral Argument re-set per joint request of counsel for Sep. 3, 2010 09:30 AM in Courtroom 6B before Judge Sue L. Robinson. (nmf) (Entered: May 5, 2010).
Motion for Discovery Motion for the Admission of the Expert Testimony of John T. Goolkasian Relating to the Certificate of Correction for U.S. Patent No. 7,067,396—filed by MEMC Electronic Materials Inc.. (Rogowski, Patricia) (Entered: May 7, 2010).
Opening Brief in Support re 141 Motion for Discovery *Motion for the Admission of the Expert Testimony of John T. Goolkasian Relating to the Certificate of Correction for U.S. Patent No. 7,067,396* filed by MEMC Electronic Materials Inc..Answering Brief/Response due date per Local Rules is May 24, 2010. (Attachments: # 1 Exhibit 1, # 2 Exhibit 2, # 3 Exhibit 3, # 4 Exhibit 4, # 5 Exhibit 5, # 6 Exhibit 6, # 7 Exhibit 7, # 8 Exhibit 8, # 9 Exhibit 9, # 10 Exhibit 10, # 11 Exhibit 11, # 12 Exhibit 12, # 13 Exhibit 13, # 14 Exhibit 14, # 15 Exhibit 15)(Rogowski, Patricia) (Entered: May 7, 2010).
Notice of Service of CD-ROM including re-submittal of documents Bates No. SOIT 00310798-00336526 as Document Bates No. SOIT 00310798 in native format by SOITEC Silicon on Insulator Technologies SA. (Attachments: # 1 Certificate of Service)(Kraft, Denise) (Entered: May 20, 2010).
Notice of Service of Amended Notices of Videotaped Deposition of (1) Dr. Bernard Aspar and (2) Dr. Michel Bruel by MEMC Electronic Materials Inc..(Rogowski, Patricia) (Entered: May 21, 2010).
Answering Brief in Opposition re 141 Motion for Discovery *Motion for the Admission of Expert Testimony of John T. Goolkasian Relating to the Certificate of Correction for U.S. Patent No. 7,067,396 Plaintiff's Answering Brief in Opposition to Defendant's Motion for the Admission of Expert Testimony of John T. Goolkasian* filed by SOITEC Silicon on Insulator Technologies SA.Reply Brief due date per Local Rules is Jun. 4, 2010. (Attachments: # 1 Certificate of Service)(Kraft, Denise) (Entered: May 24, 2010).
Declaration re 145 Answering Brief in Opposition,, *Declaration of Marcus T. Hall in Support of Plaintiff's Answering Brief in Opposition to Defendant's Motion for the Admission of Expert Testimony of* John T. Goolkasian by SOITEC Silicon on Insulator Technologies SA. (Attachments: # 1 Exhibit a, # 2 Exhibit B, # 3 Exhibit C, # 4 Exhibit D, # 5 Exhibit E, # 6 Exhibit F, # 7 Exhibit G, # 8 Exhibit H, # 9 Exhibit I, # 10 Exhibit J, # 11 Exhibit K, # 12 Exhibit L, # 13 Exhibit M, # 14 Exhibit N, # 15 Certificate of Service)(Kraft, Denise) (Entered: May 24, 2010).
Letter to the Honorable Sue L. Robinson from Denise Seastone Kraft, Esq. regarding [Proposed] Third Stipulation to Amend Scheduling Order—re 26 Scheduling Order,,,. (Attachments: # 1 Text of Proposed Order)(Kraft, Denise) (Entered: May 25, 2010). Correcting Entry: Stipulation attached to D.I. 147 has been deleted due to document being filed improperly. Counsel is advised to re-file document using the Stipulation event code (lid) (Entered: May 25, 2010).
Stipulation [Proposed] Third Stipulation to Amend Scheduling Order re 26 Scheduling Order,,, 147 Letter by Commissariat a LEnergie Atomique, SOITEC Silicon On Insulator Technologies SA, SOITEC U.S.A., Inc.. (Kraft, Denise) (Entered: May 25, 2010). So Ordered—re 148 to Amend Scheduling Order. Order—Setting Scheduling Order Deadlines (Claims Construction Opening Brief due by Jun. 25, 2010., Discovery due by Jul. 30, 2010., Dispositive Motions due by Jul. 2, 2010., Answering Brief due Jul. 16, 2010., Reply Brief due Jul. 30, 2010.). Signed by Judge Sue L. Robinson on May 26, 2010. (lid) (Entered: May 26, 2010).
Notice of Service of Expert Reports of (1) Peter Moran, (2) John T. Goolkasian, (3) Robert Averback, and (4) Pascal Bellon by MEMC Electronic Materials Inc.. (Rogowski, Patricia) (Entered: Jun. 2, 2010).
Notice of Service of S.O.I.TEC Silicon on Insulator Technologies, S.A.'s Production 31 of CD-ROM Documents Bates No. SOIT 00476382 to SOIT 00476394 by SOITEC Silicon on Insulator Technologies SA. (Attachments: # 1 Certificate of Service)(Kraft, Denise) (Entered: Jun. 2, 2010).
Notice of Service of (1) Expert Report of Andrew Hirt; (2) Expert Report of John Bravman regarding Invalidity of United States Patent No. 5,834,812; and (3) Expert Report of John Bravman regarding Infringement by Defendant MEMC by Commissariat a LEnergie Atomique, SOITEC Silicon on Insulator Technologies SA, Soitec U.S.A., Inc.. (Attachments: # 1 Certificate of Service)(Kraft, Denise) (Entered: Jun. 2, 2010).
Reply Breif *in Support of 141 Motion for Discovery Motion for the Admission of the Expert Testimony of John T. Goolkasian Relating to the Certificate of Correction for U.S. Patent No. 7,067,396* filed by MEMC Electronic Materials Inc.. (Attachments: # 1 Exhibit 1, # 2 Exhibit 2, # 3 Exhibit 3, # 4 Exhibit 4, # 5 Exhibit 5, # 6 Exhibit 6)(Rogowski, Patricia) Modified on Jun. 4, 2010 (lid). (Entered: Jun. 4, 2010).
Notice of Service of S.O.I.TEC Silicon on Insulator Technologies, S.A.'s Production 32 of CD-ROM Documents Bates No. SOIT 00476395 to SOIT 00476441 by SOITEC Silicon on Insulator Technologies SA, (Attachments: # 1 Certificate of Service)(Kraft, Denise) (Entered: Jun. 7, 2010).Joint Claim Construction Statement by Commissariat.Silicon on Insulator Technologies Sa, Soitec U.S.A., Inc.. (Attachments: # 1 Certificate of Service)(Kraft, Denise) (Entered: Jun. 14, 2010).
Statement re 148 Stipulation *Joint Claim Construction Statement* by Commissariat a LEnergie Atomique, SOITEC Silicon on Insulator Technologies SA, SOITEC U.S.A., Inc.. (Attachments # 1 Certificate of Service)(Kraft, Denise) Entered: Jun. 14, 2010
Claim Construction Chart by Commissariat a LEnergie Atomique, SOITEC Silicon on Insulator Technologies SA, SOITEC U.S.A., Inc.. (Attachments: # 1 Certificate of Service)(Kraft, Denise) (Entered: Jun. 14, 2010).
Notice of Service of (1) S.O.I.TEC Silicon on Insulator Technologies, S.A.'s Production 33 of CD-ROM Documents Bates No. SOIT 00476442 to SOIT 00476456; and (2) S.O.I.TEC Silicon on Insulator Technologies, S.A.'s Production 33 Supplement including CD-ROM Documents Bates No. SOIT 00476442 to SOIT 00476456 (duplicates of Production 33) and SOIT 00476457 (Burg Translations, Inc. Certification) by SOITEC Silicon on Insulator Technologies SA. (Attachments: # 1 Certificate of Service)(Kraft, Denise) (Entered: Jun. 15, 2010).
Sur-reply Brief re 141 Motion for Discovery *Motion for the Admission of Expert Testimony of John T. Goolkasian Relating to the Certificate of Correction for U.S. Patent No. 7,067,396 Surreply by Plaintiffs to Motion by Defendant for the Admission of Expert Testimony of John T. Goolkasian* filed by SOITEC Silicon on Insulator Technologies SA. (Attachments: # 1 Certificate of Service)(Kraft, Denise) (Entered: Jun. 15, 2010).
Declaration re 157 Sur-Reply Brief, *Declaration of Marcus T. Hall in Support of Surreply by Plaintiffs to Motion by Defendant for the Admission of Expert Testimony of John T. Goolkasian* by SOITEC Silicon on Insulator Technologies SA. (Attachments: # 1 Exhibit A,# 2 Exhibit B, # 3 Exhibit C, # 4 Exhibit D, # 5 Certificate of Service)(Kraft, Denise). (Entered: Jun. 15, 2010).
Notice of Service of Videotaped Depositions for Dr. John C. Bravman and Andrew M. Hirt by MEMC Electronic Materials Inc. (Rogowski, Patricia) (Entered: Jun. 18, 2010).
Stipulation Stipulated Motion for Leave to Exceed Page Limit Under Delaware L.R. 7.1.3 by MEMC Electronic Materials Inc.. (Rogowski, Patricia) (Entered: Jun. 21, 2010); So Ordered- re 160 Stipulated Motion for Leave to Exceed Page Limit. Signed by Judge Sue L. Robinson on Jun. 22, 2010. (lid) (Entered: Jun. 22, 2010).
Notice of Service of (1) Rebuttal Expert Report of Robert Averback; (2) Report on Characterization of Si Wafers by Transmission Electron Microscopy (Pascal Bellon); and (3) Rebuttal Expert Report of Peter Moran by MEMC Electronic Materials Inc.. (Rogowski, Patricia) (Entered: Jun. 22, 2010).
Notice of Service of Supplemental Expert Report of Peter Moran by MEMC Electronic Materials Inc..(Rogowski, Patricia) (Entered: Jun. 22, 2010).
Notice of Service of Documents Marked MEMC0781986-MEMC0782012 by MEMC Electronic Materials Inc..(Rogowski, Patricia) (Entered: Jun. 23, 2010).
Notice of Service of S.O.I.TEC Silicon on Insulator Technologies, S.A. and Commissariat a L'Energie Atomique's: (1) Notice of Deposition of Dr. Peter Moran; (2) Notice of Deposition of Dr. Robert Averback; and (3) Notice of Deposition of Dr. Pascal Bellon by Commissariat a LEnergie Atomique, SOITEC Silicon on Insulator Technologies SA. (Attachments: # 1 Certificate of Service)(Kraft, Denise) (Entered: Jun. 24, 2010).
Notice of Service of S.O.I.TEC Silicon on Insulator Technologies, S.A. and Commissariat a L'Energie Atomique's List of Fact Witnesses by Commissariat a LEnergie Atomique, SOITEC Silicon on Insulator Technologies SA. (Attachments: # 1 Certificate of Service)(Kraft, Denise) (Entered: Jun. 24, 2010).
Notice of Service of S.O.I.TEC Silicon on Insulator Technologies, S.A. and Commissariat a L'Energie Atomique's: (1) Supplemental Expert Report of Andrew M. Hirt; and (2) Expert Report of John C. Bravman Regarding Non-infringement of U.S. Patent No. 5,834,812 by Commissariat a LEnergie Atomique, SOITEC Silicon on Insulator Technologies SA. (Attachments: # 1 Certificate of Service)(Kraft, Denise) (Entered: Jun. 24, 2010).
Claim Construction Opening Brief filed by MEMC Electronic Materials Inc.. (Attachments: # 1 Appendix DA0001-DA0006, # 2 Appendix DA0007-DA0032, # 3 Appendix DA0033-DA0072, # 4 Appendix DA0073-DA0112, # 5 Appendix DA0113- DA0152, # 6 Appendix DA0153-DA0192, # 7 Appendix DA0193-DA0232, # 8 Appendix DA0233-DA0272, # 9 Appendix DA0273-DA0312, # 10 Appendix DA0313- DA0352, # 11 Appendix DA0353-DA0392, # 12

Appendix DA0393-DA0432, # 13 Appendix DA0433-DA0472, # 14 Appendix DA0473-DA0512, # 15 Appendix DA0513- DA0521, # 16 Appendix DA0522-DA0545, # 17 Appendix SEALED—DA0546-DA0551, # 18 Appendix DA0552-DA0563, # 19 Appendix SEALED—DA0564- DA0566, # 20 Appendix DA0567-DA0573, # 21 Appendix SEALED—DA0574- DA0599, # 22 Appendix DA0600-DA0604, # 23 Appendix DA0605-DA0609, # 24 Appendix DA0610-DA0625, # 25 Appendix DA0626-0634, # 26 Appendix DA0635, # 27 Appendix DA0636-DA0652, # 28 Appendix SEALED—DA0653-DA0657, # 29 Appendix DA0658-DA0667, # 30 Appendix DA0668-DA0670, # 31 Appendix DA0671- DA0678, # 32 Appendix DA0679-DA0687, # 33 Appendix DA0688-DA0696, # 34 Appendix SEALED—DA0697-DA0705, # 35 Appendix SEALED—DA0706-DA0711, # 36 Appendix SEALED—DA0712-DA0714, # 37 Appendix DA0715-DA0717, # 38 Appendix DA0718-DA0719, # 39 Appendix DA0720-DA0722, # 40 Appendix DA0723-DA0732, # 41 Appendix DA0733-DA0740, # 42 Appendix DA0741-DA0749, # 43 Appendix DA0750-DA0769, # 44 Appendix DA0770-DA0781)(Rogowski, Patricia) (Entered: Jun. 25, 2010).

Claim Construction Opening Brief *Plaintiffs S.O.I.TEC Silicon on Insulator Technologies, S.A. and Commissariat a L'Energie Atomique's Opening Claim Construction Brief* filed by Commissariat a LEnergie Atomique, SOITEC Silicon on Insulator Technologies SA. (Attachments: # 1 Certificate of Service)(Kraft, Denise) (Entered: Jun. 25, 2010).

Declaration re 168 Claim Construction Opening Brief, *Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon on Insulator Technologies SA. (Attachments: # 1 Certificate of Service)(Kraft, Denise) (Entered: Jun. 25, 2010).

Sealed Exhibit re 169 Declaration, *Exhibit A (Filed Under Seal) to Declaration of Marcus T. Hall in Support of Plaintiffd S.O.I.TEC Silicon on Insulator Technologies, S.A. and Commissariat a L'Energie Atomique's Opening Claim Construction Brief* by Commissariat a LEnergie Atomique, SOITEC Silicon on Insulator Technologies SA. (Attachments: # 1 Certificate of Service)(Kraft, Denise) (Entered: Jun. 25, 2010).

Sealed Exhibit re 169 Declaration, *Exhibit B (Filed Under Seal) to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon on Insulator Technologies SA. (Attachments: # 1 Certificate of Service) (Kraft, Denise) (Entered: Jun. 25, 2010).

Sealed Exhibit re 169 Declaration, *Exhibit C (Filed Under Seal) to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon on Insulator Technologies SA. (Attachments: # 1 Certificate of Service)(Kraft,Denise) (Entered: Jun. 25, 2010).

Notice of filing the following document(s) in paper format: Joint Appendix of Exhibits to Opening and Answering Claim Construction Briefs (1) vol. I—JA0001 to JA0533; (2) vol. II—JA0534 to JA0930; (3) vol. III—JA0931 to JA1502; (4) vol. IV—JA1503 to JA1510 (Filed Under Seal); (5) vol. V—JA1511 to JA2089; and (6) vol. VI—JA2090 to JA2557. Original document(s) to be filed with the Clerk's Office. Notice filed by Denise Seastone Kraft on behalf of Commissariat a LEnergie Atomique, SOITEC Silicon on Insulator Technologies SA (Attachments: # 1 Certificate of Service)(Kraft, Denise) (Entered: Jun. 25, 2010); Correcting Entry: Docket clerk deleted appendices to D.I. 167 due to documents being filed improperly. Counsel is advised to re-file appendices separately using the Appendix event code. Counsel is also advised that sealed documents may not be filed with public view documents. (lid) (Entered: Jun. 28, 2010).

(Document too large to file in pdf format, will file at later date by Express Mail). Appendix re 167 Claim Construction Opening Brief,,,,,, by MEMC Electronic Materials Inc.. (Attachments: # 1 Appendix DA-0001—DA-0006, # 2 0007—DA-0032, # 3 Appendix DA-0033—DA-0072, # 4 Appendix DA-0073—DA-0112, Appendix # 5 Appendix DA-0113 DA-0152, # 6 Appendix DA-0153—DA-0192, # 7 Appendix DA-0193—DA-0232, # 8 Appendix DA-0233—DA-0272, # 9 Appendix DA-0273—DA-0312, # 10 Appendix DA-0313—DA-0352, # 11 Appendix DA-0353—DA-0392, # 12 Appendix DA-0393—DA-0432, # 13 Appendix DA-0433—DA-0472, # 14 Appendix 0473—DA-0512, # 15 Appendix DA-0513—DA-0521)(Rogowski, Patricia) (Entered: Jun. 28, 2010).

Sealed Appendix re 167 Claim Construction Opening Brief,,,,,, by MEMC Electronic Materials Inc.. (Rogowski, Patricia) (Entered: Jun. 28, 2010)

Notice of Service of S.O.I.TEC Silicon on Insulator Technologies, S.A. and Commissariat a L'Energie Atomique's Production 34 of CD-ROM Documents Bates No. SOIT 00476458 to SOIT 00476602 by SOITEC Silicon on Insulator Technologies SA. (Attachments: # 1 Certificate of Service)(Kraft, Denise) (Entered: Jun. 28, 2010).

Redacted Version of 175 Appendix by MEMC Electronic Materials Inc.. (Attachments: # 1 Appendix DA0522-DA0545, # 2 Appendix DA0546-DA0551, # 3 DA0552-DA0563, # 4 Appendix DA0564-DA0566, # 5 Appendix DA0567-DA0573, # 6 Appendix DA0574-DA0599, # 7 Appendix DA0600-DA0604, # 8 Appendix DA0605-DA0609,# 9 Appendix DA0610-DA0625, # 10 Appendix DA0626-DA0634, # 11 Appendix DA06035, # 12 Appendix DA0636-DA0652, # 13 Appendix DA0653-DA0657, # 14 Appendix DA0658-DA0667, # 15 Appendix DA0668-DA0670, # 16 Appendix DA0671-DA0678, # 17 Appendix DA0679-DA0687, # 18 Appendix DA0688-DA0696, # 19 Appendix DA0697-DA0705, # 20 Appendix DA0706-DA-0711, # 21 Appendix DA0712-DA0714, # 22 Appendix DA0715-DA0717, # 23 Appendix DA0718-DA0719, # 24 Appendix DA0720-DA0722, # 25 Appendix DA0723-DA0732, # 26 Appendix DA0733-DA0740, # 27 Appendix DA0741-DA0749, # 28 Appendix DA0750-DA0769, # 29 Appendix DA0770-DA0781, # 30 Certificate of Service)(Rogowski, Patricia) (Entered: Jun. 28, 2010).

(Document too large to file in pdf format, will file at later date by Express Mail). Notice of filing the following document(s) in paper format: Joint Appendix of Exhibits to Opening and Answering Claim Construction Briefs (1) vol. I—JA0001 to JA0533. Appendix vol. I. re 173 Notice of in paper Filing Paper Documents(Oversized Document, Item on file in the Clerks Office). (lid) (Entered: Jun. 28, 2010).

(Document too large to file in pdf format, will file at later date by Express Mail). Notice of filing the following document(s) in paper format: Joint Appendix of Exhibits to Opening and Answering Claim Construction Briefs (2) vol. II—JA0534 to JA0930. Appendix vol. II. re 173 Notice of Filing Paper Documents(Oversized Document, Item on File in the Clerks Office). (lid) (Entered: Jun. 28, 2010).

(Document too large to file in pdf format, will file at later date by Express Mail). Notice of filing the following document(s) in paper format: Joint Appendix of Exhibits to Opening and Answering Claim Construction Briefs (3) vol. III—JA0931 to JA1502. Appendix vol. III. re 173 Notice of Filing Paper Documents(Oversized Document, Item on File in the Clerks Office) (lid) (Entered: Jun. 28, 2010).

(Document too large to file in pdf format, will file at later date by Express Mail). Notice of filing the following document(s) in paper format: Joint Appendix of Exhibits to Opening and Answering Claim Construction Briefs (4) vol. IV—JA1503 to JA1510. Appendix vol. IV. re 173 Notice of Filing Paper Documents, (Oversized Document, Item on File in theClerks Office) (lid) (Entered: Jun. 28, 2010).

(Document too large to file in pdf format, will file at later date by Express Mail). Notice of filing the following document(s) in paper format: Joint Appendix of Exhibits to Opening and Answering Claim Construction Briefs (5) vol. V—JA1511 to JA2089.

(Document too large to file in pdf format, will file at later date by Express Mail). vol. VI—JA2090 to JA2557. Original document(s) to be filed with the Clerk's Office. Notice filed by Denise Seastone Kraft on behalf of Commissariat a LEnergie Atomique, Soitec Silicon on Insulator Technologies SA (Attachments: # 1 Certificate of Service)(Kraft, Denise) (Entered: Jun. 25, 2010).

Sealed Appendix re 168 Claim Construction Opening Brief, *Joint Appendix of Exhibits to Opening and Answering Claim Construction Briefs* vol. IV of VI—*Filed Under Seal* by Commissariat a LEnergie Atomique, SOITEC Silicon on Insulator Technologies SA. (Attachments:#1 Certificate of Service)(Kraft, Denise) (Entered: Jun. 28, 2010).

Notice of Service of S.O.I.TEC Silicon on Insulator Technologies, S.A.'s and Commissariat a L'Energie Atomique's List of Rebuttal Fact Witnesses by Commissariat a LEnergie Atomique, SOITEC Silicon on Insulator Technologies SA. (Attachments: # 1 Certificate of Service)(Kraft, Denise) (Entered: Jun. 30, 2010).

Notice of Service of Amended Notice of Videotaped Deposition of Dr. John C. Bravman by MEMC Electronic Materials Inc.. (Rogowski, Patricia) (Entered: Jun. 30, 2010).

Motion in Limine *SOITEC/CEA Parties' Motion to Exclude the Expert Report of Dr. Pascal Bellon and any Related Testimony*—filed by Commissariat a LEnergie Atomique, SOITEC Silicon on Insulator Technologies SA. (Attachments: # 1 Text of Proposed Order, # 2 Certificate of Service)(Kraft, Denise) (Entered: Jul. 2, 2010).

Motion for Partial Summary Judgment of *Invalidity of the Asserted Aspar Patent Claims*—filed by MEMC Electronic Materials Inc.. (Attachments: # 1 Text of Proposed Order, # 2 Certificate of Service)(Rogowski, Patricia) (Entered: Jul. 2, 2010).

Opening Brief in Support re 186 Motion in Limine *SOITEC/CEA Parties' Motion to Exclude the Expert Report of Dr. Pascal Bellon and any Related Testimony* filed by Commissariat a LEnergie Atomique, SOITEC Silicon on Insulator Technologies SA.Answering Brief/Response due date per Local Rules is Jul. 19, 2010. (Attachments: # 1 Certificate of Service)(Kraft, Denise) (Entered: Jul. 2, 2010).

Opening Brief in Support re 187 Motion for Partial Summary Judgment *of Invalidity of the Asserted Aspar Patent Claims* filed by MEMC Electronic Materials Inc..Answering Brief/Response due date per Local Rules is Jul. 19, 2010.(Rogowski, Patricia) (Entered: Jul. 2, 2010).

Sealed Appendix re 189 Opening Brief in Support, by MEMC Electronic Materials Inc..(Attachments # 1 Table of Contents, # 2 Certificate of Service)(Rogowski, Patricia) (Entered: Jul. 2, 2010).

(Document too large to file in pdf format, will file at later date by Express Mail). Appendix re 186 Motion in Limine *SOITEC/CEA Parties' Motion to Exclude the Expert Report of Dr. Pascal Belton and any Related Testimony Plaintiffs' Omnibus Appendix to Daubert Motion and Motions for Partial Summary Judgment Filed on Jul. 2, 2010* by Commissariat a LEnergie Atomique, SOITEC Silicon on Insulator Technologies SA. (Attachments: # 1 Appendix vol. II of XIX, # 2 Appendix vol. III of of XIX, # 3 Appendix vol. IV XIX, # 4 Appendix vol. V of XIX, # 5 Appendix vol. VII of of XIX, # 6 Appendix vol. IX of XIX, # 7 Appendix vol. XI of XIX, # 8 Appendix vol. XII of XIX, # 9 Appendix vol. XV of XIX, # 10 Appendix vol. XIV of XIX, # 11 Appendix vol. vol. XVI of XIX, # 12 Appendix vol. XVI of XIX, # 13 Appendix vol. XVIII of XIX, # 14 Appendix Certificate of Service)(Kraft, Denise) (Entered: Jul. 2, 2010).

Sealed Appendix re 186 Motion in Limine *SOITEC/CEA Parties' Motion to Exclude the Expert Report of Dr. Pascal Belton and any Related Testimony Plaintiffs' Omnibus Appendix to Daubert Motion and Motions for Partial Summary Judgment Filed on Jul. 2, 2010*—vol. VI of XIX (Filed Under Seal) by Commissariat a LEnergie Atomique, SOITEC Silicon on Insulator Technologies SA. (Attachments: # 1 Certificate of Service)(Kraft, Denise) (Entered: Jul. 2, 2010).

Sealed Appendix re 186 Motion in Limine *SOITEC/CEA Parties' Motion to Exclude the Expert Report of Dr. Pascal Belton and any Related Testimony Plaintiffs' Omnibus Appendix to Daubert Motion and Motions for Partial Summary Judgment Filed on Jul. 2, 2010*—vol. VIII of XIX (Filed Under Seal) by Commissariat a LEnergie Atomique, SOITEC Silicon on Insulator Technologies SA. (Attachments: # 1 Certificate of Service)(Kraft, Denise) (Entered: Jul. 2, 2010).

Sealed Appendix re 186 Motion in Limine *SOITEC/CEA Parties' Motion to Exclude the Expert Report of Dr. Pascal Belton and any Related Testimony Plaintiffs' Omnibus Appendix to Daubert Motion and Motions for Partial Summary Judgment Filed on Jul. 2, 2010*—vol. XVII of XIX (Filed Under Seal) by Commissariat a LEnergie Atomique, SOITEC Silicon on Insulator Technologies SA. (Attachments: # 1 Certificate of Service)(Kraft, Denise) (Entered: Jul. 2, 2010).

Sealed Appendix re 186 Motion in Limine *SOITEC/CEA Parties' Motion to Exclude the Expert Report of Dr. Pascal Belton and any Related Testimony Plaintiffs' Omnibus Appendix to Daubert Motion and Motions for Partial Summary Judgment Filed on Jul. 2, 2010*—vol. XIX of XIX (Filed Under Seal) by Commissariat a LEnergie Atomique, SOITEC Silicon on Insulator Technologies SA. (Attachments: # 1 Certificate of Service)(Kraft, Denise) (Entered: Jul. 2, 2010).

Sealed Opening Brief in Support re 197 Sealed Motion for Summary Judgment *SOITEC/CEA Parties' Motion for Summary Judgment: Non-Infringement (Filed Under Seal)*—filed by Commissariat a LEnergie Atomique, SOITEC Silicon on Insulator Technologies SA. (Attachments: # 1 Certificate of Service)(Kraft, Denise) (Entered: Jul. 2, 2010).

Motion for Summary *Non-Infringement*—filed by Soitec/Cea Under Seal) is Jul. 19, 2010. Jul. 02, 2010) for Summary Judgment: for Summary Judgment Non-Infringement (Filed Soitec Silicon on Insulator due date per Local Rules Denise) (Entered:.

Motion for Summary Judgment of *Non-Infringement*—filed by MEMC Electronic Materials Inc.. (Attachments: # 1 Text of Proposed Order, # 2 Certificate of Service)(Rogowski, Patricia) (Entered: Jul. 2, 2010).

Sealed Opening Brief in Support re 199 Motion for Judgment of *Non-Infringement* filed by MEMC Electronic Materials Inc..Answering Brief/Response due date per Local Rules is Jul. 19, 2010. (Attachments: # 1 Certificate of Service)(Rogowski, Patricia) (Entered: Jul. 2, 2010).

Sealed Appendix re 200 Opening Brief in Support, by MEMC Electronic Materials Inc.. (Attachments: # 1 Table of Contents, # 2 Certificate of Service)(Rogowski, Patricia) (Entered: Jul. 2, 2010).

Motion for Partial Summary Judgment *SOITEC/CEA Parties Motion for Partial Summary Judgment That the Patents in Suit Satisfy the Written Description Requirement*—filed by Commissariat a LEnergie Atomique, SOITEC Silicon on Insulator Technologies SA. (Attachments: # 1 Certificate of Service)(Kraft, Denise) (Entered: Jul. 2, 2010).

Opening Brief in Support re 202 Motion for Partial Summary Judgment *SOITEC/CEA Parties Motion for Partial Summary Judgment That the Patents in Suit Satisfy the Written Description Requirement* filed by Commissariat a LEnergie Atomique, SOITEC SA, Silicon on Insulator Technologies SA, SOITEC U.S.A., due date per Local Rules is Jul. 19, 2010. (Attachments: # 1 Certificate of Service) (Kraft, Denise) (Entered: Jul. 2, 2010).

Motion for Partial Summary Judgment *Plaintiffs' Motion for Partial Summary Judgment That the Certificate of Correction for the '396 Patent is Valid*—filed by Commissariat a LEnergie Atomique, SOITEC Silicon on Insulator Technologies SA.Answering Brief/Response due date per Local Rules is Jul. 19, 2010. (Attachments: # 1 Certificate of Service)(Kraft, Denise) (Entered: Jul. 02, 2010).

Opening Brief in Support re 204 Motion for Partial Summary Judgment *Plaintiffs' Motion for Partial Summary Judgment That Certificate of Correction for the '396 Patents is Valid* filed by Commissariat a LEnergie Atomique, SOITEC Silicon on Insulator Technologies SA.Answering Brief/Response due date per Local Rules is Jul. 19, 2010. (Attachments: # 1 Certificate of Service)(Kraft, Denise) (Entered: Jul. 2, 2010).

Motion for Partial Summary Judgment *SOITEC/CEA Parties' Motion for Partial Summary Judgment That the Aspar Patents are not Invalid for Inequitable Conduct*—filed by Commissariat a LEnergie Atomique, SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).

Opening Brief in Support re 206 Motion for Partial Summary Judgment *SOITEC/CEA Parties' Motion for Partial Summary Judgment That the Aspar Patents are not Invalid for Inequitable Conduct*—filed by Commissariat a LEnergie Atomique, SOITEC Silicon on Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).

Motion for Partial Summary Judgment *Plaintiffs' Motion for Partial Summary Judgment That the Bruel Patent Does Not Anticipate the Aspar Patents*—filed by Commissariat a LEnergie Atomique, SOITEC Silicon on Insulator Technologies SA. (Attachments: # 1 Text of Proposed Order, # 2 Certificate of Service)(Kraft, Denise) (Entered: Jul. 2, 2010).

Opening Brief in Support re 208 Motion for Partial Summary Judgment *Plaintiffs' Motion for Partial Summary Judgment That the Bruel Patent Does the Patents Not Anticipate the Aspar Patents by Commissariat a LEnergie Atomique, SOITEC Silicon on Insulator Technologies* SA.Answering Brief/Response due date per Local Rules is Jul. 19, 2010. (Attachments: # 1 Certificate of Service)(Kraft, Denise) (Entered: Jul. 2, 2010).

Motion for Partial Summary Judgment *SOITEC's Motion for Partial Summary Judgment of Invalidity of United States Patent No. 5,834,812 for Lack of Enablement*—filed by SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).

Opening Brief in Support re 210 Motion for Partial Summary Judgment SOITEC's Motion for Partial Summary Judgment of Invalidity of United States Patent No. 5,834,812 for Lack of Enablement filed by SOITEC Silicon on Insulator Technologies SA, SOITEC U.S.A., Inc.. Answering Brief/Response due date per Local Rules is Jul. 19, 2010. (Attachments: # 1 Certificate of Service)(Kraft, Denise) (Entered: Jul. 2, 2010).

Motion for Partial Summary Judgment *SOITEC's Motion for Partial Summary Judgment for Invalidity of Asserted Claims of United States Patent No. 5,834,812 in View of Prior Art*—filed by SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).

Motion for Partial Summary Judgment *That the Best Mode Requirement is Satisfied for the Claims '009 and '396 Patents*—filed by Commissariat a LEnergie Atomique, SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).

Opening Brief in Support re 212 Motion for Partial Summary Judgment *SOITEC's Motion for Partial Summary Judgment for Invalidity of Asserted Claims of United States Patent No. 5,834,812 in View of Prior Art* filed by SOITEC Silicon on Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).

Opening Brief in Support re 213 Motion for Partial Summary Judgment *That the Best Mode Requirement is Satisfied for the Claims of the '009 and '396 Patents* filed by SOITEC Silicon on Insulator Technologies SA.Answering Brief/Response due date per Local Rules is Jul. 19, 2010. (Attachments: # 1 Certificate of Service)(Reed,John) (Entered: Jul. 2, 2010).

Correcting Entry: Per request of counsel, D.I. No. 216 has been deleted and will be re-filed at a later time (lid) (Entered: Jul. 7, 2010).

Correcting Entry: Per request of counsel, D.I. No. 217 has been deleted and will be re-filed at a later time (lid) (Entered: Jul. 7, 2010).

Redacted Version of 200 Opening Brief in Support, by MEMC Electronic Materials Inc.. Attachments: # 1 Certificate of Service)(Rogowski, Patricia) (Entered: Jul. 7, 2010); Correcting Entry: Per request of counsel, D.I. No. 216 and 217 have been deleted and will be re-filed at a later time (lid) (Entered: Jul. 7, 2010).

Redacted Version of 201 Appendix by MEMC Electronic Materials Inc.. (Attachments: # 1 MA001-MA0004, # 2 Appendix MA0005-MA0010, # 3 Appendix MA0011-MA0016, # 4 Appendix MA0017-MA0020, # 5 Appendix MA0021-MA0029, # 6 Appendix MA0030-MA0045, # 7 Appendix MA0046-MA0052, # 8 MA0053-MA0078 # 9 Appendix MA0079-MA0092, # 10 Appendix MA0130-MA0148, # 11 Appendix MA0130-MA0148 # 12 Appendix MA0149-MA0160, # 13 MA0161-MA0163, # 14 Appendix MA0164-MA0167, # 15 Appendix MA0168-MA0172, # 16 Appendix MA0173-MA0183, # 17 Appendix MA0184-MA0196, # 18 Appendix MA0197-MA0207, # 19 Appendix MA0208-MA0241, # 20 MA0242-MA0245, # 21 Appendix MA0246-MA0249, # 22 Appendix MA0250-MA0252, # 23 Appendix MA0253-MA0265, # 24 Appendix MA0266-MA0360, # 25 Appendix MA0282-MA0312, # 26 Appendix MA0313-MA0359, # 27 Appendix MA0360-MA0365, # 28 Appendix MA0366, # 29 Appendix MA0367-MA0400, # 30 Appendix MA0401-MA0474, # 31 Appendix MA0475-MA0483, # 32 Certificate)(Rogowski, Patricia) (Entered: Jul. 7, 2010).

Redacted Version of 190 Appendix by MEMC Electronic Materials Inc.. (Attachments: # 1 MA0484-MA0489, # 2 Appendix MA0490-MA0515, # 3 Appendix MA0516-MA0534, # 4 Appendix MA0535-MA0541, # 5 Appendix MA0542-MA0550, # 6 Appendix MA0551-MA0561, # 7 Appendix MA0562-MA0564, # 8 MA0565-MA0569 # 9 Appendix MA0570-MA0574, # 10 Appendix MA0575-MA0576, # 11 Appendix MA0577-MA0601# 12 Appendix MA0602-MA0603, # 13 MA0604-MA0605, # 14 Appendix MA0606-MA0609, # 15 Appendix MA0610-MA0612, # 16 Appendix MA0613-MA0625, # 17 Appendix MA0626-MA0628, # 18 Appendix MA0629-MA0630, # 19 Appendix MA0631-MA0635, # 20 MA0654-MA0685, # 21 Appendix MA0686-MA0701, # 22 Appendix MA0702-MA0732, # 23 Appendix MA0733-MA0742, # 24 Appendix MA0743-MA0750, # 25 Appendix MA0751-MA0766, # 26 Appendix MA0767-MA0772, # 27 Appendix MA0773-MA780, # 28 Appendix MA0781-MA0807, # 29 Appendix MA0808-MA0824, # 30 Appendix MA0825-MA0831.1, # 31 Appendix MA0832-MA0838, # 32 Appendix MA0839-MA0844, # 33 Appendix MA0845-MA0858, # 34 Appendix MA0859-MA0868, # 35 Appendix MA0869-MA0877, # 36 Appendix MA0878-MA0884, # 37 Appendix MA0885-MA0887, # 38 Appendix MA0888-MA0891, # 39 Appendix MA0892-MA0909, # 40 Appendix MA910-MA0931, # 41 Certificate of Service)(Rogowski, Patricia) (Entered: Jul. 7, 2010).

Redacted Version of 198 Opening Brief in Support,, *SOITEC/CEA Parties' Opening Brief in Support of Motion for Summary Judgment: Non-Infringement* by Commissariat a LEnergie Atomique, SOITEC Silicon on Insulator Technologies SA, SOITEC U.S.A., Inc.. (Kraft, Denise) (Entered: Jul. 8, 2010).

Redacted Version of 197 Sealed Motion for Summary Judgment *SOITEC/CEA Parties' Motion for Summary Judgment: Non-Infringement (Filed Under Seal)Sealed Motion for Summary SOITEC/CEA Parties' Motion for Summary Judgment: Non-Infringement (Filed Under Seal) SOITEC/CEA Parties' Motion for Summary Judgment: Non-Infringement* by Commissariat a LEnergie Atomique, SOITEC Silicon on Insulator Technologies SA, SOITEC U.S.A., Inc.. (Kraft, Denise) (Entered: Jul. 8, 2010).

Redacted Version of 192 Appendix, *Plaintiffs' Omnibus Appendix to Daubert Motion and Motion for Partial Summary Judgment* Filed on Jul. 2, 2010—vol. VI of XIX by Commissariat a LEnergie Atomique, SOITEC Silicon on Insulator Technologies SA, SOITEC U.S.A., Inc.. (Kraft, Denise) (Entered: Jul. 9, 2010).

Redacted Version of 193 Appendix, *Plaintiffs' Omnibus Appendix to Daubert Motion and Motion for Partial Summary Judgment* Filed on Jul. 2, 2010—vol. VIII of XIX by Commissariat a LEnergie Atomique, SOITEC Silicon on Insulator Technologies SA, SOITEC U.S.A., Inc.. (Kraft, Denise) (Entered: Jul. 9, 2010).

Redacted Version of 194 Appendix, *Plaintiffs' Omnibus Appendix to Daubert Motion and Motion for Partial Summary Judgment* Filed on Jul. 2, 2010—vol. X of XIX by Commissariat a LEnergie Atomique, SOITEC Silicon on Insulator Technologies SA, SOITEC U.S.A., Inc.. (Kraft, Denise) (Entered: Jul. 9, 2010).

Redacted Version of 195 Appendix, *Plaintiffs' Omnibus Appendix to Daubert Motion and Motion for Partial Summary Judgment* Filed on Jul. 2, 2010—vol. VII of XIX by Commissariat a LEnergie Atomique, SOITEC Silicon on Insulator Technologies SA, SOITEC U.S.A., Inc.. (Kraft, Denise) (Entered: Jul. 9, 2010).

Redacted Version of 196 Appendix, *Plaintiffs' Omnibus Appendix to Daubert Motion and Motion for Partial Summary Judgment* Filed on Jul. 2, 2010—vol. XIX of XIX by Commissariat a LEnergie Atomique, SOITEC Silicon on Insulator Technologies SA, SOITEC U.S.A., Inc.. (Kraft, Denise) (Entered: Jul. 9, 2010).

Claim Construction Answering Brief re 168 Claim Construction Opening Brief, by MEMC Electronic Materials Inc.. (Attachments: # 1 Certificate of Service)(Rogowski, Patricia) (Entered: Jul. 9, 2010).

Appendix re 228 Claim Construction Answering Brief by MEMC Electronic Materials Inc.. (Attachments: # 1Appendix DA0782_DA0783, # 2 Appendix DA0784-DA0785, # 3 Appendix DA0786, # 4 Appendix DA0787-DA0810, # 5 Appendix DA0811-DA0834, # 6 Appendix DA0835-DA0845, # 7 Appendix DA0846-DA0855, # 8 Certificate of Service)(Rogowski, Patricia) (Entered: Jul. 9, 2010).

Claim Construction Answering Brief re 168 Claim Construction Opening Brief, 228 Claim Construction Answering Brief *Plaintiffs S.O.I.TEC on Insulato Technologies, S.A. and Commissariat A*

*Energie Atomique's Answering Claim Construction Brief* filed Commissariat a LEnergie Atomique, SOITEC Silicon on Insulator Technologies SA, SOITEC U.S.A., Inc.. (Attachments: # 1 Certificate of Service)(Kraft, Denise) (Entered: Jul. 9, 2010).
Appendix re 230 Claim Contruction Answering Breif, *Appendix to Plaintiffs S.O.T.TEC on Insulator Technologies, S.A. and Commissariat A Energie Atomique's Answering Claim Construction Brief* by Commissariat a Lenergie Atomique, SOITEC Silicon on Insulator Technologies SA. (Attachments: # 1 Appendix PA-0001-PA-0050, # 2 Appendix PA-0051-PA-0083, # 3 Certificate of Service)(Kraft, Denise) (Entered: Jul. 9, 2010).
Redacted Version of 183 Appendix, *Joint Appendix of Exhibits to Opening and Answering Claim Construction Briefs* vol. IV of VI by Commissariat a LEnergie Atomique, SOITEC Silicon on Insulator Technologies SA. (Kraft, Denise) (Entered: Jul. 12, 2010).
Redacted Version of 170 Exhibit to a Document, *Exhibit A to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a L'Energie Atomique, SOITEC Silicon on Insulator Technologies SA. (Kraft, Denise) (Entered: Jul. 12, 2010).
Redacted Version of 171 Exhibit to a Document, *Exhibit B to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a L'Energie Atomique, SOITEC Silicon on Insulator Technologies SA. (Kraft, Denise) (Entered: Jul. 12, 2010).
Redacted Version of 172 Exhibit to a Document, *Exhibit C to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a L'Energie Atomique, SOITEC Silicon on Insulator Technologies SA. (Kraft, Denise) (Entered: Jul. 12, 2010).
Letter to the Honorable Sue L. Robinson from Denise Seastone Kraft, Esq. regarding Courtesy CD-ROM (1) Plaintiffs' Answering Claim Construction Brief and Appendix; and (2) Plaintiffs' Daubert Motion; Plaintiffs' Motions for Partial Summary Judgment; and Plaintiffs' Omnibus Appendix to Daubert Motion and Motions for Partial Summary Judgment. (Kraft, Denise) (Entered: Jul. 12, 2010).
Notice of Service of Re-Notice of Deposition of Dr. Peter Moran on behalf of S.O.I.TEC Silicon on Insulator Technologies, S.A., Commissariat a L'Energie Atomique, and SOITEC U.S.A., Inc. by Commissariat a LEnergie Atomique, SOITEC Silicon on Insulator Technologies SA, SOITEC U.S.A., Inc.. (Attachments: # 1 Certificate of Service)(Kraft, Denise) (Entered: Jul. 13, 2010).
Fourth Stipulation to Amend Scheduling Order re 26 Scheduling Order,,, by MEMC Electronic Materials Inc.. (Rogowski, Patricia) (Entered: Jul. 15, 2010).
Answering Brief in Opposition re 186 Motion in Limine *SOITEC/CEA Parties' Motion to Exclude the Expert Report of Dr. Pascal Bellon and any Related Testimony* filed by MEMC Electronic Materials Inc.. Reply Brief due date per Local Rules is Jul. 29, 2010. (Rogowski, Patricia) (Entered: Jul. 19, 2010).
Sealed Appendix re 239 Answering Brief in Opposition, by MEMC Electronic MaterialInc.. (Attachments: # 1 Tableof Contents, # 2 Certificate of Service)(Rogowski, Patricia) (Entered: Jul. 19, 2010).
Sealed Answering Brief in Opposition re 213 Motion for Partial Summary Judgment *That the Best Mode Requirement is Satisfied for the Claims of the '009 and '396 Patents* filed by MEMC Electronic Materials Inc.. Reply Brief due date per Local Rule is Jul. 29, 2010. (Rogowski, Patricia) (Entered: Jul. 19, 2010).
Answering brief in Opposition re 208 Motion for Partial Summary Judgment *Plaintiffs' Motion for Partial Summary Judgment That the Bruel Patent Does not Anticipate the Aspar Patents* filed by MEMC Electronic Materials Inc..Reply Brief due date per Local Rule is Jul. 29, 2010. (Rogowski, Patricia) (Entered: Jul. 19, 2010).
Answering brief in Opposition re 202 Motion for Partial Summary Judgment *SOITEC/CEA Parties Motion for Partial Summary Judgment That the Patent in Suit Satisfy the Written Description Requirement* filed by MEMC Electronic Materials Inc..Reply Brief due date per Local Rule is Jul. 29, 2010. (Rogowski, Patricia) (Entered: Jul. 19, 2010).
Answering brief in Opposition re 204 Motion for Partial Summary Judgment *Plaintiffs' Motion for Partial Summary Judgment That the Certificate of Correction for the '396 Patent is Valid* filed by MEMC Electronic Materials Inc..Reply Brief due date per Local Rule is Jul. 29, 2010. (Rogowski, Patricia) (Entered: Jul. 19, 2010).
Answering brief in Opposition re 210 Motion for Partial Summary Judgment *SOITEC's Motion for Partial Summary Judgment for Invalidity of Asserted Claims of United States Patent No. 5,834,812 for Lack of Enablement* filed by MEMC Electronic Materials Inc.. Reply Brief due date per Local Rule is Jul. 29, 2010. (Rogowski, Patricia) (Entered: Jul. 19, 2010).
Answering brief in Opposition re 212 Motion for Partial Summary Judgment *SOITEC's Motion for Partial Summary Judgment for Invalidity of Asserted Claims of United States Patent No. 5,834,812 in View of Prior Art* filed by MEMC Electronic Materials Inc..Reply Brief due date per Local Rule is Jul. 29, 2010. (Rogowski, Patricia) (Entered: Jul. 19, 2010).
Sealed Answering Brief in Opposition re 187 Motion for Partial Summary *Judgment of Invalidity of the Asserted Aspar Patent Claims Plaintiffs' Answering Brief in Opposition to Defendant's Motion for Partial Summary Judgment of Invalidity of the Asserted Aspar Claims—Filed Under Seal* filed by Commissariat a LEnergie Atomique, SOITEC Silicon in Insulator Technologies SA.Reply Brief due date per Local Rule is Jul. 29, 2010. (Attachments: # 1 Certificate of Service)(Kraft, Denise) (Entered: Jul. 19, 2010).
Appendix re 247 Answering Brief in Opposition,, *Appendix to Plaintiffs' Answering Brief in Opposition to Defendant's Motion for Partial Summary Judgment of Invalidity of the Asserted Aspar Claims* (PA-1103-PA-1156) by Commissariat a LEnergie Atomique, SOITEC Silicon on Insulator Technologies SA. (Attachments: # 1 PA-1102-PA-1109—Filed Under Seal, # 2 Exhibit PA-1110-PA-1118—Filed Under Seal, # 3 Exhibit PA-1119-PA-1130—Filed Under Seal, # 4 Exhibit PA-1131-PA-1143—Filed Under Seal, # 5 Exhibit PA-1144-PA-1156, # 6 Certificate of Service)(Kraft, Denise) (Entered: Jul. 19, 2010).
Sealed Answering Brief in Opposition re 197 Motion for Partial Summary Judgment *SOITEC/CEA Parties' Motion for Summary Judgment: Non-Infringement (Filed Under Seal)*Sealed Motion for Summary Judgment *SOITEC/CEA Parties' Motion for Summary Judgment: Non-Infringement (Filed Under Seal)* filed by MEMC Electronic Materials Inc..Reply Brief due date per Local Rule is Jul. 29, 2010. (Rogowski, Patricia) (Entered: Jul. 19, 2010).
Sealed Answering Brief in Opposition re 199 Motion for Summary Judgment of *Non-Infringement Soitec's Brief in Opposition to Defendant's Motion for Summary Judgment of Non-Infringement* filed by Commissariat a LEnergie Atomique, SOITEC Silicon on Insulator Technologies SA.Reply Brief due date per Local Rules is Jul. 29, 2010. (Attachments: # 1 Certificate of Service)(Kraft, Denise) (Entered: Jul. 19, 2010).
Sealed Appendix re 250 Answering Brief in Opposition, *Appendix to Plaintiffs' Answering Brief in Opposition to Defendant's Motion for Summary Judgment of Non-Infringement* by Commissariat a LEnergie Atomique, SOITEC Silicon on Insulator Technologies SA. (Attachments: # 1 Exhibit PA-1157-PA-1159 Filed Under Seal, # 2 Exhibit PA-1160-PA-1165 File Under Seal, # 3 Exhibit PA-1166-PA-1168 File Under Seal, # 4 Exhibit PA-1169-PA-1185 Filed Under Seal, # 5 PA-1186-PA1189)(Kraft, Denise) (Entered: Jul. 19, 2010).
Appendix re 250 Answering Brief in Opposition, *Appendix to Plaintiffs' Answering Brief in Opposition to Defendant's Motion for Summary Judgment of Non-Infringement* by Commissariat a LEnergie Atomique, SOITEC Silicon on Insulator Technologies SA. (Attachments: # 1 Exhibit PA-1190-PA-1191, # 2 Certificate of Service)(Kraft, Denise) (Entered: Jul. 19, 2010).
Sealed Answering Brief in Opposition re 206 Motion for Partial Summary Judgment *SOITEC/CEA Parties' Motion for Partial Summary Judgment That the Aspar Patents are not Invalid for Inequitable Conduct* filed by MEMC Electronic Materials Inc..Reply Brief due date per Local Rules is Jul. 29, 2010. (Rogowski, Patricia) (Entered: Jul. 19, 2010); Correcting Entry: Docket clerk deleted sealed exhibits 1-4 attached to D.I. 248 due to documents being filed improperly. Counsel is advised that sealed and public documents may not be filed together and re-file documents using the Exhibit to a Document even code indicationg that documents are under seal. (lid) (Entered: Jul. 20, 2009).

Sealed Appendix re 247 Answering Brief in Opposition, *Appendix to Plaintiffs' Answering Brief in Opposition to Defendant's Motion for Summary Judgment of Invalidity of the Asserted Aspar Claims* (PA-1103-PA-1143 Filed Under) by Commissariat a LEnergie Atomique, SOITEC Silicon on Insulator Technologies SA. (Attachments: # 1 Exhibit PA-1103-PA-1109 Filed Under Seal, # 2 Exhibit PA-1110-PA-1118 File Under Seal, # 3 Exhibit PA-1119-PA-1130 File Under Seal, # 4 Exhibit PA-1131-PA-1143, # 5 Certificate of Service)(Kraft, Denise) (Entered: Jul. 20, 2010).

Notice of Service of Documents Marked MEMC0782013-MEMC0782178 by MEMC Electronic Materials Inc..(Rogowski, Patricia) (Entered: Jul. 21, 2010).

Letter to the Honorable Sue L. Robinson from Denise Seastone Kraft, regarding Courtesy CD-ROM (1) Plaintiffs Answering Brief in Opposition to Defendants Motion for Partial Summary Judgment of Invalidity of the Asserted Aspar Claim and Appendix; and (2) Soitecs Brief in Opposition to Defendants Motion for Summary Judgment of Non-Infringement and Appendix. (Kraft, Denise) (Entered: Jul. 21, 2010); so Ordered- re 238 Stipulation to Amend Scheduling Order. Order- Setting Scheduling Order Deadlines (Reply Brief due Jul. 30, 2010.)(Refer to Stipulation for Details). Signed by Judge Sue L. Robinson on Jul. 22, 2010. (lid) (Entered: Jul. 22, 2010).

Redacted Version of 241 Answering Brief in Opposition, *to Plaintiffs' Motion for Partial Summary Judgment that the Best Mode Requirement is Satisfied for the Claims of the '009 and '396 Patents* by MEMC Electronic Materials Inc.. (Rogowski, Patricia) (Entered: Jul. 26, 2010).

Redacted Version of 249 Answering Brief in Opposition, *to Plaintiffs' Motion for Partial Summary Judgment on the Infringement of U.S. Patents No. 5,834,812* by MEMC Electronic Materials Inc.. (Rogowski, Patricia) (Entered: Jul. 26, 2010).

Redacted Version of 253 Answering Brief in Opposition, *to Plaintiffs' Motion for Partial Summary Judgment that the Aspar Patents Are Not Invalid for Inequitable Conduct* by MEMC Electronic Materials Inc.. (Rogowski, Patricia) (Entered: Jul. 26, 2010).

(Document too large to file in pdf format, will file at later date by Express Mail). Redacted Version of 240 Appendix by MEMC Electronic Materials Inc.. (Attachments: # 1 Appendix MA0932-MA0985, # 2 Appendix MA0986-MA1039.22, # 3 Appendix MA1040-MA1144, # 4 Appendix MA1145-MA1200, # 5 Appendix MA1201-MA1265, # 6 Appendix MA4265.1-MA1338, # 7 Appendix MA1339-MA1547, # 8 Appendix MA1548-MA1627, # 9 Appendix MA1628-MA1693, # 10 Appendix MA1694-MA1953, # 11 Appendix MA1954-MA2127# 12 Appendix MA2128-MA2206, # 13 Appendix MA2207-MA2253, # 14 Appendix MA2254-MA2333, # 15 Appendix MA2274-MA2333, # 16 Appendix MA2334-MA2337, # 17 Appendix MA2338-MA2342, # 18 Appendix MA2343-MA2346, # 19 Appendix MA2347-MA2351, # 20 Certificate of Service)(Rogowski, Patricia) (Entered: Jul. 26, 2010).

Sealed Answering Brief in Opposition re 213 Motion for Partial Summary Judgment *That the Best Mode Requirements is Satisfied for the Claims of the '009 and '396 Patents Corrected Version of D.I. 241* filed by MEMC Electronic Materials Inc..Reply Brief due date per Local Rules is Aug. 5, 2010. (Rogowski, Patricia) (Entered: Jul. 26, 2010).

Redacted Version of 261 Answering Brief in Opposition, *to Plaintiffs' Motion for Partial Summary Judgment that the Best Mode Requirement is Satisfied for the Claims of the '009 and '396 Patents* (Corrected Version of D.I. 241) by MEMC Electronic Materials Inc.. (Rogowski, Patricia) (Entered: Jul. 26, 2010).

Redacted Version of 250 Answering Brief in Opposition, to Soitec's Brief in Opposition to Defendant's Motion for Partial Summary Judgment of Non-Infringement by Commissariat a LEnergie Atomique, SOITEC Silicon on Insulator Technologies SA. (Attachments: # 1 Certificate of Service)(Kraft, Denise) (Entered: Jul. 26, 2010).

Redacted Version of 247 Answering Brief in Opposition,,*to Plaintiffs' Answering Brief in Opposition to Defendant's Motion for Partial Summary Judgment of of Invalidity of the Asserted Aspar Claims* by Commissariat a LEnergie Atomique, SOITEC Silicon on Insulator Technologies SA. (Attachments: # 1 Certificate of Service)(Kraft, Denise) (Entered: Jul. 26, 2010).

Redacted Version of 254 Appendix,,*to Appendix to Plaintiffs' Answering Brief in Opposition to Defendant's Motion for Partial Summary Judgment of of Invalidity of the Asserted Aspar Claims* (PA-1103-PA-1143 by Commissariat a LEnergie Atomique, SOITEC Silicon on Insulator Technologies SA. (Attachments: # 1 Certificate of Service)(Kraft, Denise) (Entered: Jul. 26, 2010).

Redacted Version of 251 Appendix,, *to Appendix to Plaintiffs' Answering Brief in Opposition to Defendant's Motion for Summary Judgment of Non-Infringement* by Commissariat a LEnergie Atomique, SOITEC Silicon on Insulator Technologies SA. (Kraft, Denise) (Entered: Jul. 26, 2010).

Sealed Reply Brief re 187 Motion for Partial Summary Judgment of *Invalidity of the Asserted Aspar Patent Claims* filed by MEMC Electronic Materials Inc.. (Attachments: # 1 Certificate of Service)(Rogowski, Patricia) (Entered: Jul. 30, 2010).

Reply Brief re 204 Motion for Partial Summary Judgment Plaintiffs's Motion for Partial Summary Judgment That the Certificate of Correction for the '396 Patent is Valid Reply Brief in Support of Plaintiffs' Motion for Partial Summary Judgment That the Certificate of Correction for the '396 Patent is Valid filed by Commissariat a LEnergie Atomique, SOITEC Silicon on Insulator Technologies SA. (Attachments: # 1 Certificate of Service)(Kraft, Denise) (Entered: Jul. 30, 2010).

Sealed Appendix re 267 Reply Brief in *Support of MEMC's Motion for Partial Summary Judgment of Invalidity of the Asserted Aspar Patent Claims* by MEMC Electronic Materials Inc.. (Attachments: # 1 Table of Contents, # 2 Certificate of Service)(Rogowski, Patricia) (Entered: Jul. 30, 2010).

Declaration re 268 Reply Brief, *Declaration of Marcus T. Hall in Support of Reply Brief in Support of Plaintiffs' Motion for Partial Summary Judgment that the Certificate of Correction for the '396 Patent is Valid* by Commissariat a LEnergie Atomique, SOITEC Silicon on Insulator Technologies SA. (Attachments: # 1 Exhinbit A, # 2 Certificate of Service) (Kraft, Denise) (Entered: Jul. 30, 2010).

Sealed Reply Brief re 199 Motion for Summary Judgment of *Non-Infringement* filed by MEMC Electronic Materials Inc.. (Attachments: # 1 Certificate of Service)(Rogowski, Patricia) (Entered: Jul. 30, 2010).

Appendix re 268 Reply Brief, *Omnibus Appendix to Plaintiff's Reply Briefs in Support of Plaintiffs' Daubert Motion and Motions and Motions for Partial Summary Judgment* (PA-1192-PA1261) by Commissariat a LEnergie Atomique, SOITEC Silicon on Insulator Technologies SA. (Attachments: # 1 Exhibit PA-1199-PA-1204, # 2 Exhibit PA-1205-1206, # 3 Exhibit PA-1206.1, # 4 Exhibit PA-1231-PA-1237, # 5 Exhibit PA-1238-PA-1245, # 6 Exhibit PA-1246-PA-1257, # 7 Exhibit PA-1258-PA-1261, # 8 Certificate of Service)(Kraft, Denise) (Entered: Jul. 30, 2010).

Sealed Appendix re 271 Reply Brief in *Support of MEMC's Motion for Summary Judgment of Non-Infringement*by MEMC Electronic Materials Inc.. (Attachments: # 1 Table of Contents, # 2 Certificate of Service)(Rogowski, Patricia) (Entered: Jul. 30, 3010).

Sealed Appendix re 272 Appendix,, *Omnibus Appendix to Plaintiffs' Reply Briefs in Support of Plaintiffs' Daubert Motion and Motions for Partial Summary Judgment* (PA-1207-PA-1230 Filed Under Seal) by Commissariat a LEnergie Atomique, SOITEC Silicon on Insulator Technologies SA. (Attachments: # 1 Exhibit PA-1192-PA-1198 (Filed Under Seal), # 2 Exhibit PA-1207-PA-1217 (Filed Under Seal), # 3 Exhibit PA-1218-PA-1230 (Filed Under Seal), # 4 Certificate of Service)(Kraft, Denise) (Entered: Jul. 30, 2010).

Reply Brief re 210 Motion for Partial Summary Judgment SOITEC's Motion for Partial Summary Judgment of Invalidity of United States Patent No. 5,834,812 for Lack of Enablement Reply Brief in Support of SOITEC's Motion for Partial Summary United States Patent No. 5,834,812 for Lack of Enablement filed by SOITEC Silicon on Insulator Technologies SA, SOITEC U.S.A., Inc. (Attachments: # 1 Certificate of Service)(Kraft, Denise) (Entered: Jul. 30, 2010).

Reply Brief re 212 Motion for Partial Summary Judgment *SOITEC's Motion for Partial Summary Judgment for Invalidity of Asserted Claims of United States Patent No. 5,834,812 in View of Prior Art* Reply Brief in Support of SOITEC's Motion for Partial Summary

*Judgment for Invalidity of Asserted Claims of United States Patent No. 5,834,812 in View of Prior Art* filed by SOITEC Silicon on Insulator Technologies SA, SOITEC U.S.A., Inc.. (Attachments: # 1 Exhibit A, # 2 Exhibit B, # 3 Certificate of Service)(Kraft, Denise)(Entered: Jul. 30, 2010).

Reply Brief re 186 Motion in Limine *SOITEC/CEA Parties' Motion to Exclude the Expert Report of Dr. Pascal Bellon and any Related Testimony Reply Brief in Support of SOITEC/CEA Parties' Motion to Exclude the Expert Report of Dr. Pascal Bellon and Any Related Testimony* filed by Commissariat a LEnergie Atomique, SOITEC Silicon on Insulator Technologies SA. (Attachments: # 1 Certificate of Service)(Kraft, Denise) (Entered: Jul. 30, 2010).

Sealed Reply Brief re 197 Sealed Motion for Summary Judgment *SOITEC/CEA Parties' Motion For Summary Judgment: Non-Infringement (Filed Under Seal)* Sealed Motion Summary Judgment *SOITEC/CEA Parties' Motion for Summary Judgment: Non-Infringement (Filed Under Seal) Reply Brief in Support of SOITEC/CEA Parties' Motion for Summary Judgment: Non-Infringement (Filed Under Seal)* filed by Commissariat a LEnergie Atomique, SOITEC Silicon on Technologies SA. (Attachments: # 1 Certificate of Service)(Kraft, Denise) (Entered: Jul. 30, 2010).

Sealed Reply Brief re 213 Motion for Partial Summary Judgment *That the Best the That the Best Mode Requirement is Satisified for the Claims of the Claims of the '009 and '396 Patents Reply Brief in Support of Plaintiffs' Motion for Partial Summary Judgment That the Best the That the Best Mode Requirement is Satisified for the Claims of the Claims of the '009 and '396 Patents (Filed Under Seal)* filed by Commissariat a LEnergie Atomique, SOITEC Silicon on Insulator Technologies SA. (Attachments: # 1 Certificate of Service)(Kraft, Denise) (Entered: Jul. 30, 2010).

Reply Brief re 202 Motion for Partial Summary Judgment *SOITEC/CEA Parties Motion for Partial Summary Judgment That the Patents in Suit Satisfy the Written Description Requirement Reply Brief in Support of SOITEC/CEA Parties' Motion for Partial Summary Judgment That the Patents in Suit Satisfy the Written Description Requirement* filed by Commissariat a LEnergie Atomique, SOITEC Silicon on SA. (Attachments: # 1 Certificate of Service)(Kraft, Denise) (Entered: Jul. 30, 2010).

Sealed Reply Brief re 208 Motion for Partial Summary Judgment *Plaintiffs' Motion for Partial Summary Judgment That the Bruel Patent Does not Anticipate the Aspar Patents Reply Brief in Support Plaintiffs' Motion for Partial Summary Judgment That the Bruel Patent Does not Anticipate the Aspar Patents (Filed Under Seal)* filed by Commissariat a LEnergie Atomique, SOITEC Silicon on Insulator Technologies SA. (Attachments:# 1 Certificate of Service)(Kraft, Denise) (Entered: Jul. 30, 2010).

Sealed Reply Brief re 206 Motion for Partial Summary Judgment *SOITEC/CEA Parties' Motion for Partial Summary Judgment That the Aspar Patents are not Invalid for Inequitable Conduct Reply Brief in Support of SOITEC/CEA Parties' Motion for Partial Summary Judgment That the Aspar Patents are not Invalid for Inequitable Conduct (File Under Seal)* filed by Commissariat a LEnergie Atomique, SOITEC Silicon on Insulator Technologies SA, SOITEC U.S.A., Inc.. (Attachments: # 1 Certificate of Service)(Kraft, Denise) (Entered: Jul. 30, 2010).

Letter to the Honorable Sue L. Robinson from Denise Seastone Kraft, Esq. regarding Courtesy CD-ROM Plaintiffs' Reply to Daubert Motion and Motions for Partial Summary Judgment, and Plaintiffs' Omnibus Appendix to the Replies. (Kraft, Denise) (Entered: Aug. 2, 2010).

Redacted Version of 269 Appendix, *To Reply Brief in Support of MEMC's Motion for Partial Summary Judgment of Invalidity of the Asserted Aspar Patent Claims* by MEMC Electronic Materials Inc.. (Attachments: # 1 Appendix Table of Contents, # 2 Appendix MA2453_MA2479, # 3 Certificate of Service)(Rogowski, Patricia) (Entered: Aug. 3, 2010).

Redacted Version of 273 Appendix *Reply Brief in Support of MEMC's Motion for Summary Judgment of Non-Infringement* MEMC Electronic Materials Inc.. (Attachments: # 1 Table of Contents, # 2 Appendix MA2352-MA2361, # 3 Appendix MA2362-MA2371, # 4 Appendix MA2372-MA2381, # 5 Appendix MA2382-MA2391, # 6 Appendix MA2392-MA2399, # 7 Appendix MA2400-MA2404, # 8 MA2405-MA2422 # 9 Appendix MA02423-MA2425, # 10 Appendix MA2426-MA2427, # 11 Appendix MA2428-MA2430,# 12 Appendix MA2431-MA2440, # 13 MA2441-MA2448, # 14 Appendix MA2449-MA2452, # 15 Appendix MA2452.1-MA2452.9, # 16 Certificate of Service)(Rogowski, Patricia) (Entered: Aug. 3, 2010).

Letter to the Honorable Sue L. Robinson from Patricia Smink Rogowski regarding CD-ROM (1) MEMC's Claim Construction Briefing, (2) MEMC's Briefs in Support of MEMC's Motion for Summary Judgment, and (3) MEMC's Briefs in Opposition to Soitec's Summary Judgment Motions. (Rogowski, Patricia) (Entered: Aug. 03, 2010).

Redacted Version of 267 Reply Brief in *Support of MEMC's Motion for oPartial Summary Judgment of Invalidity of the Asserted Aspar Patent Claims* by MEMCElectronic Materials Inc.. (Rogowski, Patricia) (Entered: Aug. 3, 2010).

Redacted Version of 271 Reply Brief in *Support of MEMC's Motion for Summary Judgment of Non-Infringement* by MEMC Electronic Materials Inc.. (Rogowski, Patricia) (Entered: Aug. 3, 2010).

* cited by examiner

STACKED STRUCTURE AND PRODUCTION METHOD THEREOF

BACKGROUND OF THE INVENTION

This application claims the benefit of priority from French Application No. 0308865, filed Jul. 21, 2003, which is incorporated herein by reference.

The general field of the invention is that of wafer level fabrication of microstructures, for example by means of micromachining or chemical processing techniques used in microelectronics (deposition and etching of layers, photolithography and so on). The invention relates more particularly to certain microstructures of the micro-electro-mechanical system (MEMS) type, such as various sensors and actuators, which are obtained by freeing mobile portions (for example membranes or seismic masses).

To obtain such microstructures, the starting material may be of the silicon-on-insulator (SOI) type, for example, which usually comprises a surface layer of silicon and an underlying buried layer of silicon oxide $SiO_2$.

There are several ways to fabricate the SOI material. See, for example, "Semiconductor Wafer Bonding", Q. Y. Tong and U. Goesele, Science and Technology, ECS Series, John Wiley, New Jersey 1999. However, most SOI materials are nowadays fabricated by the molecular bonding technique. For example, two silicon plates are bonded together by the molecular bonding technique, at least one of the two plates having a surface layer of silicon oxide. The silicon oxide layer is usually produced by thermal oxidation. One of the two plates is then thinned. An SOI type structure is obtained in this way.

Several techniques for obtaining a thin layer may be used (in the context of the present invention, a layer is regarded as thin if its thickness is less than a few tens of microns). For example, a first technique is thinning (mechanical thinning by planing and/or smoothing, and/or chemical thinning, and/or mechanical-chemical thinning). A second technique uses fracture in a fragile area created at a certain depth in one of the two plates, prior to said molecular bonding, for example by implanting one or more gaseous species; the patent application FR-2 681 472 discloses a method of the above kind, which at present is known as the "Smart-Cut®" method (see, for example "The Generic Nature of the Smart-Cut® Process for Thin-film Transfer", B. Aspar et al., Journal of Electronic Materials, Vol. 30, No 7, 2001). These methods are very suitable for obtaining thin surface layers of silicon, usually less than 2 µm thick.

It is possible to produce mobile or deformable mechanical structures from this SOI material, for example by machining the top silicon film and freeing the structure by chemically etching the whole or a portion of the underlying oxide; for example, the mechanical structure is created by plasma etching the thin surface layer of silicon and chemically etching the silicon oxide layer using hydrofluoric acid (HF).

In the context of the present invention, a layer forming part of a stacked structure is referred to as a sacrificial layer when it can be eliminated subsequently, for example during use of the stacked structure to fabricate a component having a mobile or deformable portion. The material constituting a sacrificial layer is therefore different, from the chemical or crystallographic point of view, from the material constituting the non-sacrificial layers, i.e. the layers intended to remain after eliminating the sacrificial layer. For example, if the stacked structure is made from an SOI material, the silicon oxide layer serves as a sacrificial layer and the silicon layers serve as non-sacrificial layers.

This process is relatively simple to use and produces a variety of microstructures.

Pressure sensors of high quality may be produced in this way, for example.

The accelerometer disclosed in the patent FR 2 558 263 may be cited as another example of this kind of microstructure and comprises, within a thin layer, a first portion cut out from the thin layer and a second portion consisting of the remainder of the thin layer, the first portion being connected to the second by means of flexible beams allowing the first or sensitive portion to move with a certain amplitude in the plane of the thin layer. This device is used to measure acceleration of any system to which it is attached by means of a variation in electrical capacitance caused by said movement.

Other detailed examples of such microstructures can be found in "SOI 'SIMOX'; from bulk to surface micromachining, a new age for silicon sensors and actuators", B. Diem et al., Sensors and Actuators, Vol. A 46-47, pages 8 to 16 (1995).

However, fabrication of such microstructures runs up against the following problem. During the production of the structure, and in particular at the time of drying the rinsing liquid after chemical etching with hydrofluoric acid, capillary forces between the surfaces and the liquid are very high and lead to partial or total sticking of the freed structures; another cause of sticking is a solid deposit which can be produced by said drying. In the case of the accelerometer described above, for example, this leads to the beams sticking to the substrate constituting the bottom of the cavity containing the device, which obviously prevents the beams from moving as intended in response to acceleration of the system.

The SOI structure fabrication techniques referred to above lead to interfaces between the surface layer of silicon and the buried oxide, and between the buried oxide and the substrate that are not particularly rough. This sticking problem is aggravated in that nowadays SOI structures are produced with very smooth interfaces; the thinner the oxide film, and the larger the structures to be freed, the greater the problem.

In order to avoid these problems of unwanted sticking, it is necessary to take important precautions, which make the freeing process complex, costly and difficult to control. Moreover, for reasons of reliability, such unwanted sticking of facing faces within MEMS components after the components go into service has to be prevented.

A first prior art means of preventing such sticking consists in reducing the bonding energy of the freed layer and the substrate. However, these techniques employ methods of chemical preparation of the surfaces that are incompatible with the high temperatures usually required for subsequent MEMS fabrication steps. For more details, see "Suppression of Stiction in MEMS", C. H. Mastrangelo, Proceedings of the Materials Research Society Seminar, Vol. 605, 2000.

A second prior art way to prevent this sticking is to make the effective area of contact small when these two surfaces move toward each other. A method of this kind is disclosed in the patent FR 9 508 882. It consists in holding the freed layer and the substrate at a distance by etching the intermediate sacrificial layer to create abutments on each of the facing faces of the freed layer and the substrate.

Another such method is described in "Surface Roughness Modification of Interfacial Contacts in Polysilicon Microstructures", R. L. Alley et al., Proceedings of the $7^{th}$ International Conference on Semiconductor Detectors and Actuators). That paper proposes a method of producing partially mobile components including steps leading to a component whose facing free faces have a roughness adapted to prevent unwanted sticking between said faces (see the paper for a statistical definition of roughness; for example, roughness may be measured using an atomic force microscope scanning areas 1 µm×1 µm, for example). During the step of chemical freeing of the structure, this method roughens the surfaces concerned in order for the effective area of contact to be limited to the summits of the asperities of those surfaces. The paper by R. L. Alley et al. is essentially concerned with assessing how the sticking force decreases when the roughness increases.

The method described in the above paper has the drawback that it cannot be used to produce certain types of components. In particular, the method provides for the deposition of a surface film on the substrate of the stacked structure; the person skilled in the art knows that this deposition is not always possible, for example depending on the materials concerned. For example, this method cannot produce a monocrystalline surface film to be freed if the material of the sacrificial layer is amorphous; nor can it produce a monocrystalline film, for example of silicon, on a sacrificial layer of a polymer material, because of the incompatibility of the temperature for depositing the silicon film and the temperatures that a polymer is usually able to withstand.

SUMMARY

The present invention therefore relates to a method of fabricating a stacked structure, where necessary of large size, and where applicable over the whole of the surface of a wafer having a diameter of 200 mm, for example, enabling subsequent production of any MEMS type component without sticking of mobile or deformable mechanical structures. The method must be applicable regardless of the characteristics of said components, in particular their size or the materials used, especially if the surface layer that has to be (at least partly) freed is monocrystalline or cannot be simply deposited onto the required stacked structure.

A first aspect of the invention therefore proposes a method of fabricating a stacked structure, the method being noteworthy in that it comprises the following steps:

a) a first plate and a second plate are selected such that at least one of said first and second plates has a structured surface, at least in part, b) a sacrificial layer is produced on at least a portion of the surface of the first plate and/or the surface of the second plate, and c) the two plates are bonded together.

Thus using the method of the invention produces a stacked structure comprising a sacrificial layer between two substrates and in which at least one of the two substrates is such that at least a portion of its surface in contact with said sacrificial layer is structured In the context of the invention, a surface is regarded as structured when it is essentially incapable of sticking to a predetermined other substrate. For example, a surface may be structured because of the physical-chemical nature of that surface or because of a coating applied to that surface; a surface may equally be structured because of a roughness exceeding a predetermined threshold, for example equal to approximately 0.2 nm root mean square (RMS).

Starting with the stacked structure obtained in this way, a portion of the intermediate sacrificial layer between the two plates may be eliminated, for example, to obtain two facing surfaces at least one of which is appropriately structured. This prevents the two surfaces sticking together following movement of the two substrates toward each other.

Note that, according to the invention, the structured surfaces are produced before or during fabrication of the stacked structure, and therefore independently of the fabrication of an MEMS type component.

Due to the invention, any set of materials that are subsequently useful in the production of an MEMS component may advantageously be selected to constitute the stacked structure. For example, a stack could be produced comprising a thin layer of silicon on a sacrificial layer of polymer or a thin layer of monocrystalline silicon on a sacrificial layer of silicon oxide. Note also that the method of the invention does not limit the lateral dimensions of the stacked structure obtained.

According to particular features of the invention, the free surface of a sacrificial layer or, where appropriate, of both sacrificial layers and/or, where appropriate, the free surface of one of said plates is smoothed before said step c).

These features facilitate subsequent bonding (step c)), which may be molecular bonding, for example, or bonding by means of a sacrificial bonding agent, i.e. a bonding agent that can be eliminated subsequently, for example during use of said stacked structure to fabricate a component comprising a mobile or deformable portion. Moreover, the bonding of the step c) can be assisted by mechanical means, for example, and/or by plasma and/or heat treatment, these operations being carried out during or after bonding, in a special atmosphere or in the ordinary atmosphere.

Due to these features, the diverse interfaces may in particular be consolidated and/or rendered compatible with future MEMS component production steps. Two rough surfaces that would not bond to each other spontaneously may also be made to bond in this way.

According to further particular features of the invention, at least one of said the two plates is thinned after the step c).

Due to these features, portions of an MEMS type component that become mobile after eliminating the sacrificial layer in contact therewith could be produced in the thin film obtained in this way, for example.

The two plates and the sacrificial layer may of course be either simple or composite, i.e. formed themselves of a stack of layers of diverse materials. The stacked structure obtained in this way may advantageously be of the SOI type.

For example, the first plate, and likewise the second plate, may be made of silicon, a semiconductor other than silicon, for example SiC, GaN or InP, or a non-semiconductor material, such as $LiNbO_3$, $LiTaO_3$, glass, fused silica or a superconductor material. The first plate, and likewise the second plate, may equally be any combination of the above materials, in particular a monocrystalline Si/polycrystalline Si stack, SiC/Si stack, InP/Si stack, monocrystalline SiC/polycrystalline SiC stack or SiC/$SiO_2$/polycrystalline SiC stack. The material constituting the sacrificial layer produced on the first plate and/or the material constituting the sacrificial layer produced on the second plate may be silicon oxide, for example, or a polymer material.

According to particular features, at least one of said plates initially has a surface layer. In particular, this surface layer may have the effect of structuring the surface of the plate on which it rests because of the physical-chemical nature of that surface layer.

A second aspect of the invention provides diverse stacked structures.

Firstly, the invention provides a stacked structure fabricated by any of the methods succinctly described hereinabove.

Secondly, the invention provides a stacked structure that is noteworthy in that it comprises a sacrificial layer between a first substrate and a second substrate and at least one of said first and second substrates has a surface that is structured, at least in part.

Of course, the two substrates and the sacrificial layer may be either simple or composite, i.e. formed themselves of a stack of layers of diverse materials. The stacked structure obtained in this way may be in particular of the SOI type.

For example, the first substrate, and likewise the second substrate, may be made of silicon, a semiconductor other than silicon, for example SiC, GaN or InP, or a non-semiconductor material, such as $LiNbO_3$, $LiTaO_3$, glass, fused silica or a superconductor material. The first substrate, and likewise the second substrate, may equally be any combination of the above materials, in particular a monocrystalline Si/polycrystalline Si stack, an SiC/Si stack, an InP/Si stack, a monocrystalline SiC/polycrystalline SiC stack, or an $SiC/SiO_2$/polycrystalline SiC stack. The material constituting the sacrificial layer may be silicon oxide, for example, or a polymer material.

According to other particular features of the invention, at least one of the two substrates is a thin layer.

The advantages offered by the above materials are essentially the same as those offered by the corresponding fabrication methods.

Other aspects and advantages of the invention will become apparent on reading the following detailed description of particular embodiments provided by way of nonlimiting example.

BRIEF DESCRIPTION OF DRAWINGS

The description refers to the appended drawings, in which.

DETAILED DESCRIPTION

Figure 1:
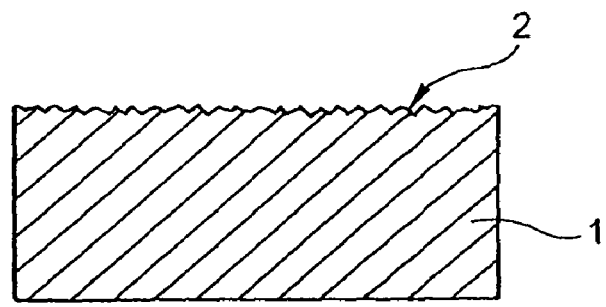
FIG. 1 represents a silicon plate prior to implementation of the invention.

The process starts with a standard silicon plate 1 whose surface 2 has a roughness $r_2$ which is usually of the order of 0.1 nm (FIG. 1).

Figure 2:
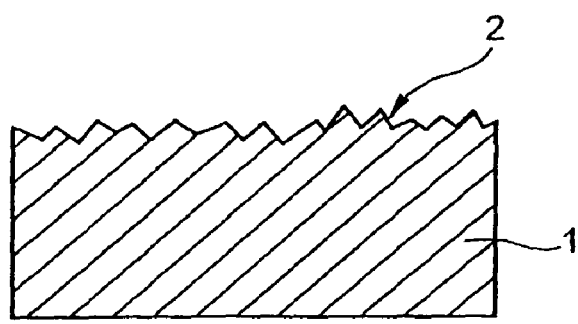
FIG. 2 shows the same silicon plate after application of a first step of one embodiment of a fabrication method of the invention.

The surface 2 of the plate 1 is then structured for example by creating a roughness $r'_2$ at the surface 2 that is preferably in the range from 0.2 nm to a few micrometers (FIG. 2). The roughness selected depends, among other things, on the thickness of the intermediate sacrificial layer, the geometrical parameters of the future component with mobile portions, and the stresses in the surface film, for example. The person skilled in the art will know how to determine the roughness to be used to prevent any unwanted sticking within the component.

To produce this roughness of the silicon surface, one or more etching steps may be effected, for example, using an RCA SC1 type mixture ($H_2O$: $NH_4OH$: $H_2O_2$ 6:1:1 at 80° C.), and/or other wet chemical etching processes (for example using a solution of TMAH or KOH), and/or dry etching processes (such as reactive or non-reactive ion sputtering). Of the techniques for producing this roughness, the following in particular may be cited:

the technique of producing black silicon, as described for example in the paper "Plasma Surface Texturization for Multicrystalline Silicon Solar Cells", M. Schnell, IEEE, XXVIII$^{th}$ Photovoltaic Conference, mechanical techniques, for example sand-blasting or grinding, techniques involving fracture in crystalline materials leaving rough substrates after fracture, as used in the Smart-Cut® process (involving implanting species and a fracture) or in the CANON Eltran® process (involving obtaining porous silicon and a fracture in the porous region), for example, chemical etching techniques well known to the person skilled in the art for producing porous materials, for example those applied to silicon, and deposition techniques, in particular deposition of silicon nitride $Si_3N_4$ by the PECVD process (note that a PECVD deposit is rougher than an LPCVD deposit).

Figure 3:
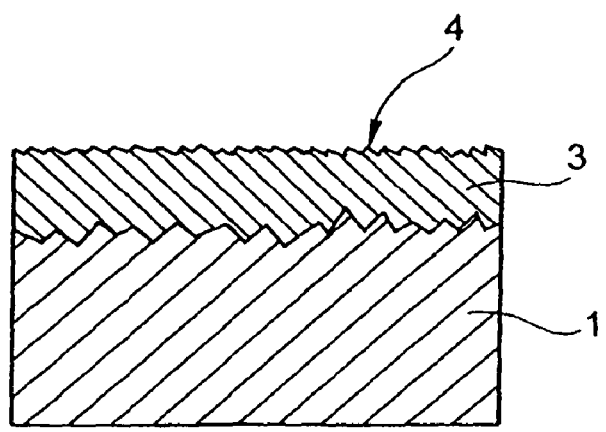
FIG. 3 represents a second step of that method.

During a second step, a sacrificial layer 3 is produced on the surface of the plate 1 (FIG. 3).

The layer 3 may be of silicon oxide, for example. In this case, it may be produced by thermal oxidation in a wet or dry atmosphere or by deposition (LPCVD, PECVD or any other appropriate deposition process). The roughness $r_4$ of the surface 4 of the layer 3 may be of the same order of magnitude as the initial roughness of the plate 1, or higher (it is known in the art to increase the roughness by depositing successive films, the roughness increasing with the number of films deposited and their thickness), or lower, for example as a result of depositing a smoothing oxide (not shown) at a low temperature, flow of which on the surface may be brought about by appropriate heat treatment, for example.

Figure 4:
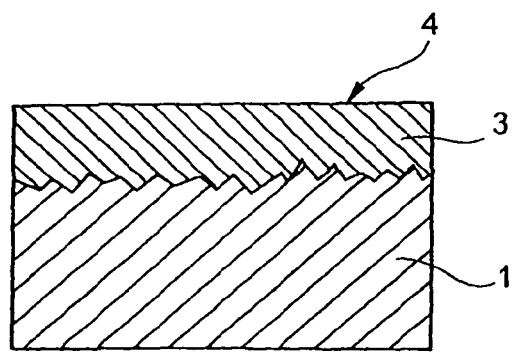
FIG. 4 represents a third step of that method.

However, in certain cases, it may be necessary to modify the roughness of the surface 4 of the layer 3 to facilitate the subsequent bonding step producing the stacked structure of the invention. To this end, a slightly lower roughness $r'_4$ may be produced, for example by carrying out a surface smoothing operation during a third step (FIG. 4), for example by light mechanical-chemical polishing and/or heat treatment in a special atmosphere and/or depositing a smoothing layer (not shown).

Figure 5:
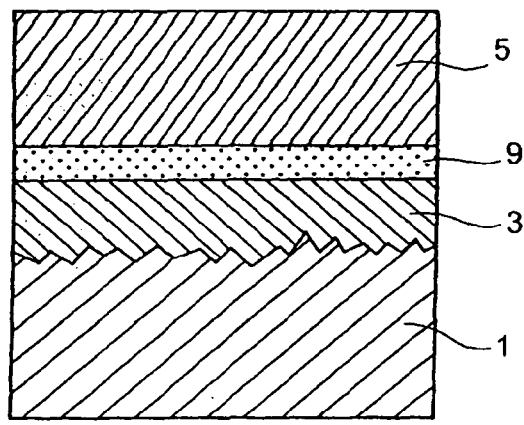
FIG. 5 represents a fourth step of that method.

During a fourth step (FIG. 5), a second plate 5, for example of polycrystalline silicon (which may have a surface layer 9 of another material, for example monocrystalline silicon or SiC), is bonded to the layer 3, preferably by molecular bonding. Bonding may equally be effected by means of a sacrificial type of bonding agent, i.e. a bonding agent that may be selectively removed, for example a photosensitive polymer.

In the case of a surface roughness incompatible with spontaneous molecular bonding of the parts to be assembled to form the stacked structure of the invention, bonding assistance may advantageously be used, firstly by placing the surfaces in contact, where applicable after applying plasma treatment to the surfaces, and then by applying mechanical stress and/or heat treatment to the stacked structure in a special atmosphere or in the ordinary atmosphere.

Heat treatment applied during or after bonding additionally consolidates the various interfaces and/or renders them compatible with future MEMS component production steps.

Figure 6:
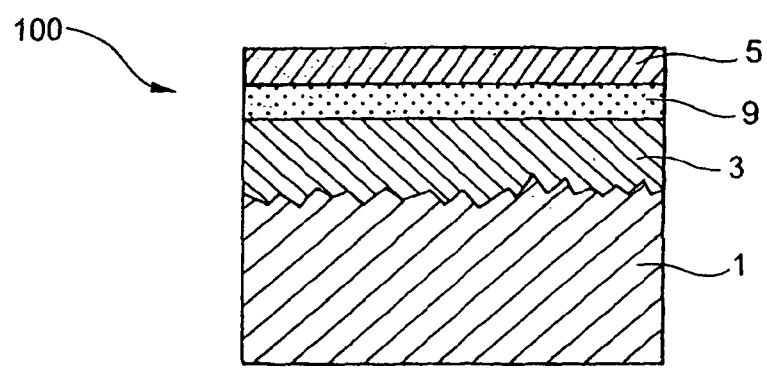
FIG. 6 represents a fifth step of that method.

Finally, during an optional fifth step, at least one of the two plates 1 and/or 5 (the plate 5 in FIG. 6) may be thinned to obtain a stacked structure 100, for example of the SOI type. Thinning may be effected by any of the prior art methods, such as those described in the introduction.

Note that it is perfectly feasible, in a variant of the invention, to place the steps of the method of producing the microstructure, for example the etching of areas in the sacrificial layer in contact with the mobile portions, in the middle of the steps that have just been described, for example before the bonding step. In this case, the mobile portions may also be defined in the plate that is subsequently thinned before the bonding step; after bonding and thinning of the plate comprising the mobile portions, heat treatment may be applied to strengthen the bonding interface of the stacked structure with no pressure stresses (said areas underlying the mobile portions giving onto the surface).

The embodiment described above may be modified or generalized in various ways. In particular, the method may relate to the whole or only a portion of the surface of at least one of the plates or one of the films treated. For example, a predetermined structure may be obtained in a localized area using a lithographic process.

As mentioned above, a given surface may be structured without necessarily roughening it.

For example, if the other substrate is of silicon, the surface to be structured may be treated by nitriding.

Another example of this is depositing on the surface to be structured a layer of an anti-stick material, i.e. a material whose physical-chemical nature is such that it opposes subsequent unwanted sticking (the creation of roughness, surface treatment or production of an anti-stick layer techniques may be combined, of course).

Thus a surface layer 6 (not shown), for example of $Si_3N_4$, may initially be deposited onto a first plate 1 with any roughness. A roughness $r'_2$ may then be created on the surface 2 of that surface layer 6, as explained above, for example by conforming a rough surface by deposition. However, instead of or in addition to this creation of roughness, the surface of the surface layer 6 may also be prepared to render it incompatible with unwanted sticking to the substrate intended to face the surface layer 6; using prior art methods, for example, the surface of a surface layer 6 of $Si_3N_4$ may be rendered hydrophobic; materials other than silicon nitride $Si_3N_4$ may be used here, such as diamond, $Al_2O_3$ or $ZrO_2$.

The sacrificial layer 3 is then deposited onto the surface layer 6, being adapted, as explained above, for bonding, for example molecular bonding, to the plate 5 (which in this embodiment is of silicon), where applicable after a step of leveling by means of mechanical-chemical polishing or heat treatment. If necessary, bonding may be assisted in the manner explained above. During the production of the mobile structure component, selective etching of the layer 3 frees the structured surface of the surface layer 6: during this selective etching, using hydrofluoric acid, for example, the material used for the sacrificial layer 3, for example silicon oxide $SiO_2$, is etched, whereas that used for the surface layer 6, for example silicon nitride $Si_3N_4$, is not.

Embodiments are described above in which only the surface 2 of the first plate 1 is structured; however, it is clear that, within the context of the invention, it is feasible to structure the surface 7 (not shown) of the second plate 5 as well or instead (the latter plate comprising a surface layer 9, where appropriate, as described above).

Moreover, in the embodiments described above, a sacrificial layer 3 is produced only on the first plate 1; however, it is clear that, in the context of the invention, a sacrificial layer 8 (not shown) may instead or in addition be produced on the second plate 5. The two plates are then bonded as described above, where appropriate after smoothing the surface 10 (not shown) of the sacrificial layer 8.

Figure 7:
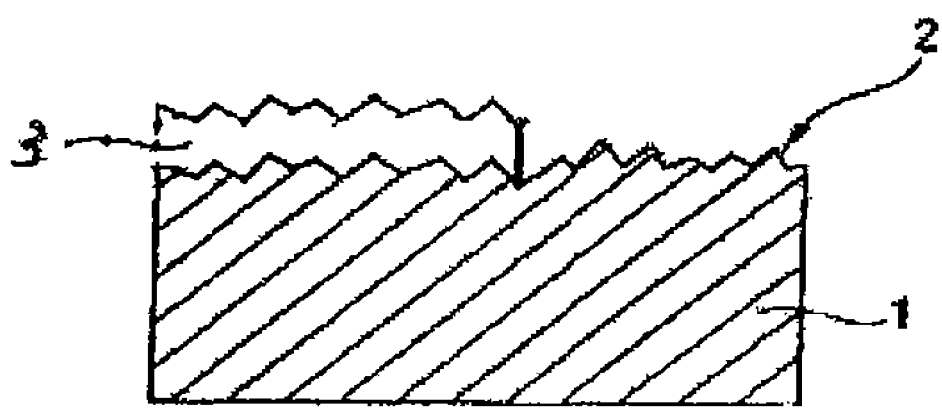
FIG. 7 illustrates the silicon plate of FIG. 3, having a non-continuous sacrificial layer.

It is clear that a non-continuous sacrificial layer 3 may be obtained as shown in FIG. 7, for example by localized deposition or by etching; this enables areas already opened up to be defined in the stacked structure.

The methods described above may be applied to any structure including a thin layer adhering to a buried layer, for example of silicon oxide, to be sacrificed locally, the latter resting on a support that may be of a material other than silicon. Depending on the requirements of the intended application, the person skilled in the art will be able to combine the methods described above to produce specific stacked structures according to the invention.

Note, finally, that the surface structuring required by the invention is not necessarily homogeneous over the whole of the surfaces concerned: for example, in certain applications it may be advantageous to produce a surface whose structuring is divided at random or in accordance with a particular distribution over the surface of one of the plates.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

The invention claimed is:

1. A method of fabricating a stacked structure comprising the following sequential steps:
   a) selecting a first plate and a second plate such that a surface portion of the first plate has a roughness such that the surface portion is incapable of sticking to a surface of the second plate,
   b) producing a sacrificial layer on at least a part of the surface of the first plate or the surface of the second plate, and
   c) bonding the first and second plates together,
   the method further comprising a step of at least partly eliminating the sacrificial layer to expose the surface portion such that the surface portion at least partially faces the second plate.

2. The method according to claim 1 wherein selecting a first plate and a second plate further comprises forming the surface having a roughness by increasing the roughness of the selected first or second plate to greater than approximately 0.2 nm root-mean-square (RMS).

3. The method according to claim 1 wherein selecting comprises selecting a least one of the plates that initially includes a surface layer.

4. The method according to claim 3, wherein selecting further comprises selecting at least one of the plates wherein the surface layer comprises a monocrystalline surface layer.

5. The method according to claim 3 wherein selecting further comprises selecting at least one of the plates wherein the surface layer comprises silicon.

6. The method according to claim 1 further comprising forming a surface layer comprising silicon nitride on one of the first or second plates.

7. The method according to claim 1 further comprising smoothing at least one of a free surface of the sacrificial layer or a free surface of at least one of the plates before the bonding.

8. The method according to claim 1 further comprising smoothing the free surface of the sacrificial layer and the free surface of at least one of the plates before the bonding.

9. The method according to claim 1 wherein bonding comprises molecular bonding.

10. The method according to claim 1 wherein bonding comprises bonding with a sacrificial bonding agent.

11. The method according to claim 1 wherein bonding further comprises bonding assisted by at least one of a mechanical means, a plasma treatment, or a thermal treatment.

12. The method according to claim 11 wherein assisting further comprises applying a selected atmosphere during bonding.

13. The method according to claim 11 wherein bonding further comprises exposing the two plates to an open air environment before bonding.

14. The method according to claim 11 wherein bonding further comprises bonding in an open air environment.

15. The method according to claim 1 wherein the method further comprises applying a selected atmosphere before bonding.

16. The method according to claim 1 further comprising thinning at least one of the first or second plates after bonding.

17. The method according to claim 1 wherein a major portion of at least one of the plates comprises a semiconductor material.

18. The method according to claim 17 wherein the major portion comprises silicon.

19. The method according to claim 1 wherein the sacrificial layer comprises silicon oxide.

20. The method according to claim 1 wherein the sacrificial layer comprises a polymer.

* * * * *